US010186514B1

(12) United States Patent
Tao et al.

(10) Patent No.: US 10,186,514 B1
(45) Date of Patent: Jan. 22, 2019

(54) BI-STABLE STATIC RANDOM ACCESS MEMORY (SRAM) BIT CELLS FORMED FROM III-V COMPOUNDS AND CONFIGURED TO ACHIEVE HIGHER OPERATING SPEEDS

(71) Applicant: QUALCOMM Incorporated, San Diego, CA (US)

(72) Inventors: Gengming Tao, San Diego, CA (US); Xia Li, San Diego, CA (US); Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/696,630

(22) Filed: Sep. 6, 2017

(51) Int. Cl.
    *H01L 27/11*     (2006.01)
    *H01L 29/10*     (2006.01)
    (Continued)

(52) U.S. Cl.
    CPC ........ *H01L 27/1104* (2013.01); *G11C 11/419* (2013.01); *H01L 21/02543* (2013.01);
    (Continued)

(58) Field of Classification Search
    CPC ............... H01L 27/1104; H01L 29/205; H01L 29/66462; H01L 21/02546; H01L 27/0605; H01L 21/02634; H01L 29/66522; H01L 29/66318; H01L 21/02543; H01L 29/7371; H01L 29/20; H01L 29/41708; H01L 29/0817; H01L 29/0821; H01L 29/1004; H01L 29/0847; H01L 29/1033; H01L 29/1095; H01L 27/0705; G11C 11/419
See application file for complete search history.

(56) References Cited

U.S. PATENT DOCUMENTS 5,243,206 A     9/1993     Zhu et al.
5,561,306 A     10/1996     Imamura et al.
(Continued)

OTHER PUBLICATIONS

Author Unknown, "Compound Semiconductor: Connecting the Compound Semiconductor Community," vol. 22, Issue 3, Apr. 2016, Compound Semiconductor, 72 pages.
(Continued)

*Primary Examiner* — Bilkis Jahan
(74) *Attorney, Agent, or Firm* — Withrow & Terranova, PLLC

(57) ABSTRACT

Bi-stable static random access memory (SRAM) bit cells formed from III-V compounds and configured to achieve higher operating speeds are disclosed. In one aspect, a bi-stable SRAM bit cell includes substrate, first well layer formed over substrate from a III-V compound doped with a first type material, and second well layer formed over first well layer from a III-V compound doped with a second type material. Channel layer is formed over second well layer from a III-V compound doped with the first type material. Source and drain regions are formed over channel layer from a III-V compound doped with the first type material, and gate region is formed over channel layer. Bipolar junction transistors (BJTs) are formed such that a data value can be stored in second well layer. Collector tap electrode is configured to provide access to collector of each BJT for reading or writing data.

29 Claims, 14 Drawing Sheets

(51) Int. Cl.
　　　*H01L 29/08*　　　(2006.01)
　　　*H01L 29/417*　　(2006.01)
　　　*H01L 29/205*　　(2006.01)
　　　*H01L 29/737*　　(2006.01)
　　　*H01L 21/02*　　　(2006.01)
　　　*H01L 29/66*　　　(2006.01)
　　　*H01L 27/06*　　　(2006.01)
　　　*G11C 11/419*　　(2006.01)
　　　*H01L 29/20*　　　(2006.01)
　　　*H01L 27/07*　　　(2006.01)

(52) U.S. Cl.
　　　CPC .. *H01L 21/02546* (2013.01); *H01L 21/02634* (2013.01); *H01L 27/0605* (2013.01); *H01L 29/0817* (2013.01); *H01L 29/0821* (2013.01); *H01L 29/0847* (2013.01); *H01L 29/1004* (2013.01); *H01L 29/1033* (2013.01); *H01L 29/1095* (2013.01); *H01L 29/20* (2013.01); *H01L 29/205* (2013.01); *H01L 29/41708* (2013.01); *H01L 29/66318* (2013.01); *H01L 29/66462* (2013.01); *H01L 29/66522* (2013.01); *H01L 29/7371* (2013.01); *H01L 27/0705* (2013.01)

(56) References Cited

U.S. PATENT DOCUMENTS

| | | | |
|---|---|---|---|
| 5,563,087 | A | 10/1996 | Shen et al. |
| 5,864,152 | A | 1/1999 | Mori |
| 5,945,713 | A * | 8/1999 | Voldman ............ H01L 27/0251 257/355 |
| 8,077,536 | B2 | 12/2011 | Widjaja |
| 8,130,547 | B2 | 3/2012 | Widjaja et al. |
| 8,582,359 | B2 | 11/2013 | Widjaja |
| 8,837,204 | B2 | 9/2014 | Asa |
| 9,001,581 | B2 | 4/2015 | Widjaja |
| 9,208,880 | B2 | 12/2015 | Louie et al. |
| 9,368,625 | B2 | 6/2016 | Louie et al. |
| 9,496,053 | B2 | 11/2016 | Han et al. |
| 9,536,595 | B2 | 1/2017 | Louie et al. |
| 9,601,493 | B2 | 3/2017 | Widjaja |
| 2003/0047750 | A1 * | 3/2003 | Russ ................... H01L 27/0262 257/173 |
| 2005/0179093 | A1 | 8/2005 | Morris |
| 2008/0253046 | A1 * | 10/2008 | Lou .................... H01L 27/0262 361/56 |
| 2012/0018804 | A1 * | 1/2012 | Khemka ............. H01L 29/1083 257/337 |
| 2013/0015517 | A1 | 1/2013 | Widjaja et al. |
| 2013/0100559 | A1 * | 4/2013 | Kuenemund ......... H01L 23/544 361/42 |
| 2013/0166990 | A1 | 6/2013 | Morris et al. |
| 2015/0091054 | A1 * | 4/2015 | Su ....................... H01L 27/0248 257/140 |
| 2016/0173081 | A1 | 6/2016 | Pan et al. |
| 2016/0343701 | A1 * | 11/2016 | Zhong ................. H01L 27/0262 |

OTHER PUBLICATIONS

Kursun, Volkan, "Body Effect Model and Reverse and Forward Body Bias," ELEC 301: CMOS VLSI Design, Hong Kong University of Science and Technology, available at least as early as Aug. 30, 2017, 6 pages.

Moyer, Bryon, "A 1T (or 2T) SRAM Bit Cell: Significant Change to SRAM Economics?" Electronic Engineering Journal, Jan. 4, 2016, 8 pages, https://www.eejournal.com/article/20160104-zeno/.

Rajagopalan, Karthik et al., "Compound Semiconductor MOSFET Structure With High-K Dielectric," CS Mantech Conference, Apr. 24-27, 2006, Vancouver, Canada, pp. 119-121.

Watanabe Y., et al., "Monolithic Integration of InGaAs/InAlAs Resonant8Tunneling Diode and Hemt for Single-Transistor Cell SRAM Application", IEEE, International Electron Devices Meeting (IEDM), 1992, pp. 475-478.

Ye, P.D. et al., "GaAs metal-oxide-semiconductor field-effect transistor with nanometer-thin dielectric grown by atomic layer deposition," Applied Physics Letters, vol. 83, No. 1, Jul. 7, 2003, American Institute of Physics, 3 pages.

* cited by examiner

BI-STABLE STATIC RANDOM ACCESS MEMORY (SRAM) BIT CELLS FORMED FROM III-V COMPOUNDS AND CONFIGURED TO ACHIEVE HIGHER OPERATING SPEEDS

BACKGROUND

I. Field of the Disclosure

The technology of the disclosure relates generally to static random access memory (SRAM) bit cells, and more particularly to bi-stable SRAM bit cells.

II. Background

Processor-based computer systems include memory for data storage. Different types of memory exist, each possessing certain unique features. For example, static random access memory (SRAM) is a type of memory that can be employed in processor-based computer systems. SRAM can store data without the need to periodically refresh the memory, unlike dynamic random access memory (DRAM) for example. An SRAM contains a plurality of SRAM bit cells (also referred to as "bit cells") organized in rows and columns in an SRAM data array. For any given row in an SRAM data array, each column of the SRAM data array includes an SRAM bit cell in which a single data value or bit is stored. Read and write operations are performed on a particular SRAM bit cell using read and write word lines which correspond to the SRAM bit cell row that includes the particular SRAM bit cell. Further, each SRAM bit cell conventionally includes six (6) transistors (i.e., a 6T SRAM bit cell), wherein four (4) transistors are used to form cross-coupled inverters for storing a data value, and two (2) transistors are used to access the cross-coupled inverters for read and write operations.

In an effort to reduce the area consumption of SRAM data arrays, SRAM bit cells with fewer than six (6) transistors have been introduced over time. FIG. 1 illustrates a conventional one transistor (1T) N-type metal-oxide semiconductor (MOS) (NMOS) bi-stable SRAM bit cell 100. In particular, the 1T NMOS bi-stable SRAM bit cell 100 includes a single NMOS transistor 102 employing a source region 104, a drain region 106, and a gate region 108. The gate region 108 includes a gate oxide layer 110, a metal gate 112 disposed over the gate oxide layer 110, and spacers 114(1), 114(2) disposed on either side of the gate oxide layer 110 and the metal gate 112. A source line SL is coupled to the source region 104, a bit line BL is coupled to the drain region 106, and a word line WL is coupled to the gate region 108. Additionally, the NMOS transistor 102 includes a buried N-type well (N-well) 116 disposed over a P-type substrate (P-substrate) 118, and a floating P-type well (P-well) 120 is formed between the source region 104 and the drain region 106. Further, shallow trench isolation (STI) regions 122(1), 122(2) are formed on either side of the floating P-well 120. A control line CL is coupled to an N-well tap 124 that is electrically coupled to the buried N-well 116 such that a bias voltage $V_{BIAS}$ may be applied to the buried N-well 116.

Designing the 1T NMOS bi-stable SRAM bit cell 100 as illustrated in FIG. 1 results in a bipolar junction transistor (BJT) 126(1) being formed from the source region 104, the floating P-well 120, and the buried N-well 116. In particular, the floating P-well 120 functions as a base B1, the source region 104 functions as an emitter E1, and the buried N-well 116 functions as a collector C1 of the BJT 126(1). Similarly, a BJT 126(2) is formed from the drain region 106, the floating P-well 120, and the buried N-well 116. The floating P-well 120 functions as a base B2, the drain region 106 functions as an emitter E2, and the buried N-well 116 functions as a collector C2 of the BJT 126(2). In this manner, a data value stored in the 1T NMOS bi-stable SRAM bit cell 100 corresponds to voltage potential (i.e., a number of carriers (i.e., holes) present) in the floating P-well 120. Thus, the 1T NMOS bi-stable SRAM bit cell 100 can be read from or written to according to the voltages applied via the source line SL, the word line WL, the bit line BL, and the control line CL. In particular, to read the 1T NMOS bi-stable SRAM bit cell 100, a voltage is applied to the word line WL to activate the NMOS transistor 102. A data value "1" is read out onto the bit line BL if a particular charge is stored in the floating P-well 120, and a data value "0" is read out onto the bit line BL if there is no stored charge, or if the stored charge is below a threshold value defining a data value "1." To write a data value "1," a voltage is applied to the word line WL to activate the NMOS transistor 102 while a positive voltage is applied to the control line CL. In response to the positive voltage applied to the control line CL, an ionization electron-hole pair is generated at a PN junction 128 corresponding to the buried N-well 116 (i.e., N) and the floating P-well 120 (i.e., P) as a result of capacitive coupling, such that hole carriers flow into the floating P-well 120 through the collectors C1, C2. To write a data value "0," a voltage is applied to the word line WL to activate the NMOS transistor 102 while a negative charge pump applies a negative voltage to the source line SL, such that hole carriers are drained from the floating P-well 120 through the emitter E1 of the BJT 126(1), which is in a forward junction state.

Although the 1T NMOS bi-stable SRAM bit cell 100 consumes less area than a conventional 6T SRAM bit cell, the 1T NMOS bi-stable SRAM bit cell 100 is not without its limitations. For example, the 1T NMOS bi-stable SRAM bit cell 100 has a relatively slow write speed.

SUMMARY OF THE DISCLOSURE

Aspects disclosed in the detailed description include bi-stable static random access memory (SRAM) bit cells formed from III-V compounds and configured to achieve higher operating speeds. As used herein, a III-V compound refers to a compound formed from one or more materials found in columns III and V of the periodic table. In one aspect, a bi-stable SRAM bit cell includes a substrate formed from a III-V compound. The bi-stable SRAM bit cell also includes a first well layer formed over the substrate from a III-V compound doped with a first type material, and a second well layer formed over the first well layer from a III-V compound doped with a second type material. A channel layer is formed over the second well layer from a III-V compound doped with the first type material. Source and drain regions are formed over the channel layer from a III-V compound doped with the first type material, and a gate region is formed over the channel layer. In this manner, the bi-stable SRAM bit cell is formed using one (1) field-effect transistor (FET) that includes the source region, the drain region, the gate region, and the channel region. Employing the elements above also results in two (2) bipolar junction transistors (BJTs) formed within the bi-stable SRAM bit cell. In particular, each BJT includes a base corresponding to the second well layer and a collector corresponding to the first well layer. One BJT has an emitter corresponding to the source region, while another BJT includes an emitter corresponding to the drain region. Based on the formation of the BJTs, a charge can be stored in the second well layer, wherein the charge corresponds to a data value of the bi-stable SRAM bit cell. A collector tap electrode is configured to provide access to the collector of each BJT to assist in reading or writing the data value. Importantly, the III-V compounds used in the bi-stable SRAM bit cell have a higher electron mobility than materials employed in conventional complementary metal-oxide semiconductor (CMOS) technology. Thus, forming the bi-stable SRAM bit cell using the III-V compounds allows the bi-stable SRAM bit cell to achieve higher operating speeds than conventional bi-stable SRAM bit cells formed from materials with a lower electron mobility.

In this regard in one aspect, a bi-stable SRAM bit cell is provided. The bi-stable SRAM bit cell comprises a substrate formed from a III-V compound. The bi-stable SRAM bit cell also comprises a first well layer formed over the substrate from a III-V compound doped with a first type material, and a second well layer formed over the first well layer from a III-V compound doped with a second type material different from the first type material. The bi-stable SRAM bit cell further comprises a channel layer formed over the second well layer from a III-V compound doped with the first type material. The bi-stable SRAM bit cell comprises a source region formed over a first side of the channel layer from a III-V compound doped with the first type material. A first BJT is formed that comprises a base corresponding to the second well layer, a collector corresponding to the first well layer, and an emitter corresponding to the source region. The bi-stable SRAM bit cell also comprises a drain region formed over a second side of the channel layer from a III-V compound doped with the first type material. A second BJT is formed that comprises a base corresponding to the second well layer, a collector corresponding to the first well layer, and an emitter corresponding to the drain region. The bi-stable SRAM bit cell further comprises a gate region disposed over the channel layer between the source region and the drain region, and a collector tap electrode disposed on the first well layer.

In another aspect, a bi-stable SRAM bit cell is provided. The bi-stable SRAM bit cell comprises a means for providing a substrate formed from a III-V compound. The bi-stable SRAM bit cell also comprises a means for providing a first well layer formed over the substrate from a III-V compound doped with a first type material. The bi-stable SRAM bit cell comprises a means for providing a second well layer formed over the first well layer from a III-V compound doped with a second type material different from the first type material. The bi-stable SRAM bit cell also comprises a means for providing a channel layer formed over the second well layer from a III-V compound doped with the first type material. The bi-stable SRAM bit cell further comprises a means for providing a source region formed over a first side of the channel layer from a III-V compound doped with the first type material. A first BJT is formed that comprises a base corresponding to the second well layer, a collector corresponding to the first well layer, and an emitter corresponding to the source region. The bi-stable SRAM bit cell further comprises a means for providing a drain region formed over a second side of the channel layer from a III-V compound doped with the first type material. A second BJT is formed that comprises a base corresponding to the second well layer, a collector corresponding to the first well layer, and an emitter corresponding to the drain region. The bi-stable SRAM bit cell also comprises a means for providing a gate region disposed over the channel layer between the source region and the drain region, and a means for providing a collector tap electrode disposed on the first well layer.

In another aspect, a method of manufacturing a bi-stable SRAM bit cell is provided. The method comprises forming a substrate from a III-V compound, and forming a first well layer over the substrate from a III-V compound doped with a first type material. The method also comprises forming a second well layer over the first well layer from a III-V compound doped with a second type material different from the first type material, and forming a channel layer over the second well layer from a III-V compound doped with the first type material. The method further comprises forming a source region over a first side of the channel layer from a III-V compound doped with the first type material. A first BJT is formed that comprises a base corresponding to the second well layer, a collector corresponding to the first well layer, and an emitter corresponding to the source region. The method also comprises forming a drain region over a second side of the channel layer from a III-V compound doped with the first type material. A second BJT is formed that comprises a base corresponding to the second well layer, a collector corresponding to the first well layer, and an emitter corresponding to the drain region. The method also comprises disposing a gate region over the channel layer between the source region and the drain region, and disposing a collector tap electrode on the first well layer.

In another aspect, an SRAM data array comprising a plurality of bi-stable SRAM bit cells organized into a plurality of SRAM bit cell rows and a plurality of SRAM bit cell columns. Each bi-stable SRAM bit cell of the plurality of bi-stable SRAM bit cells corresponds to an SRAM bit cell row and an SRAM bit cell column. The SRAM data array comprises a substrate formed from a III-V compound, a first well layer formed over the substrate from a III-V compound doped with a first type material, and a second well layer formed over the first well layer from a III-V compound doped with a second type material different from the first type material. The SRAM data array also comprises a channel layer formed over the second well layer from a III-V compound doped with the first type material, and a source region formed over a first side of the channel layer from a III-V compound doped with the first type material. A first BJT is formed that comprises a base corresponding to the second well layer, a collector corresponding to the first well layer, and an emitter corresponding to the source region. The SRAM data array also comprises a drain region formed over a second side of the channel layer from a III-V compound doped with the first type material. A second BJT is formed that comprises a base corresponding to the second well layer, a collector corresponding to the first well layer, and an emitter corresponding to the drain region. The SRAM data array also comprises a gate region disposed over the channel layer between the source region and the drain region, and a collector tap electrode disposed on the first well layer.

DETAILED DESCRIPTION

Figure 1:
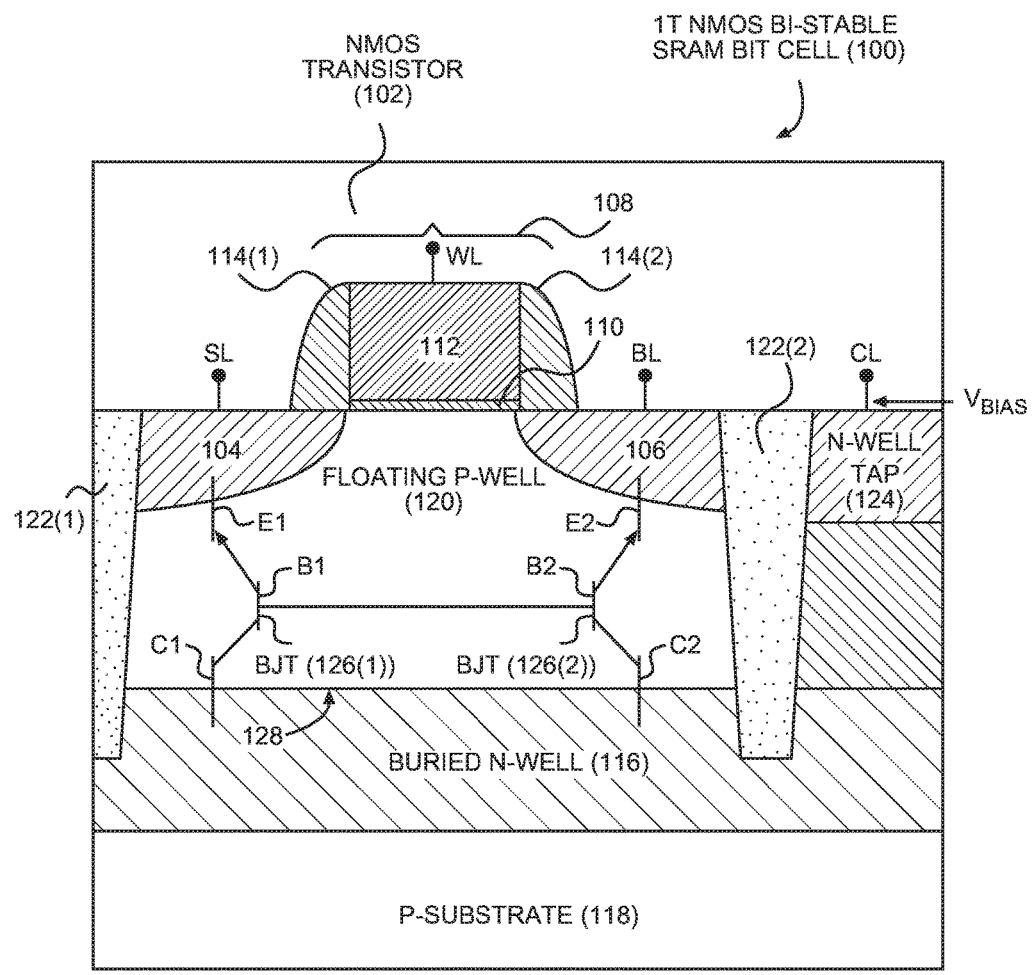
FIG. 1 is a cross-sectional diagram of a conventional one transistor (1T) N-type metal-oxide semiconductor (MOS) (NMOS) bi-stable static random access memory (SRAM) bit cell configured to achieve indirect writing through a buried N-type well (N-well) region.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include bi-stable static random access memory (SRAM) bit cells formed from III-V compounds and configured to achieve higher operating speeds. As used herein, a III-V compound refers to a compound formed from one or more materials found in columns III and V of the periodic table. In one aspect, a bi-stable SRAM bit cell includes a substrate formed from a III-V compound. The bi-stable SRAM bit cell also includes a first well layer formed over the substrate from a III-V compound doped with a first type material, and a second well layer formed over the first well layer from a III-V compound doped with a second type material. A channel layer is formed over the second well layer from a III-V compound doped with the first type material. Source and drain regions are formed over the channel layer from a III-V compound doped with the first type material, and a gate region is formed over the channel layer. In this manner, the bi-stable SRAM bit cell is formed using one (1) field-effect transistor (FET) that includes the source region, the drain region, the gate region, and the channel region. Employing the elements above also results in two (2) bipolar junction transistors (BJTs) formed within the bi-stable SRAM bit cell. In particular, each BJT includes a base corresponding to the second well layer and a collector corresponding to the first well layer. One BJT has an emitter corresponding to the source region, while another BJT includes an emitter corresponding to the drain region. Based on the formation of the BJTs, a charge can be stored in the second well layer, wherein the charge corresponds to a data value of the bi-stable SRAM bit cell. A collector tap electrode is configured to provide access to the collector of each BJT to assist in reading or writing the data value. Importantly, the III-V compounds used in the bi-stable SRAM bit cell have a higher electron mobility than materials employed in conventional complementary metal-oxide semiconductor (CMOS) technology. Thus, forming the bi-stable SRAM bit cell using the III-V compounds allows the bi-stable SRAM bit cell to achieve higher operating speeds than conventional bi-stable SRAM bit cells formed from materials with a lower electron mobility.

Figure 2:
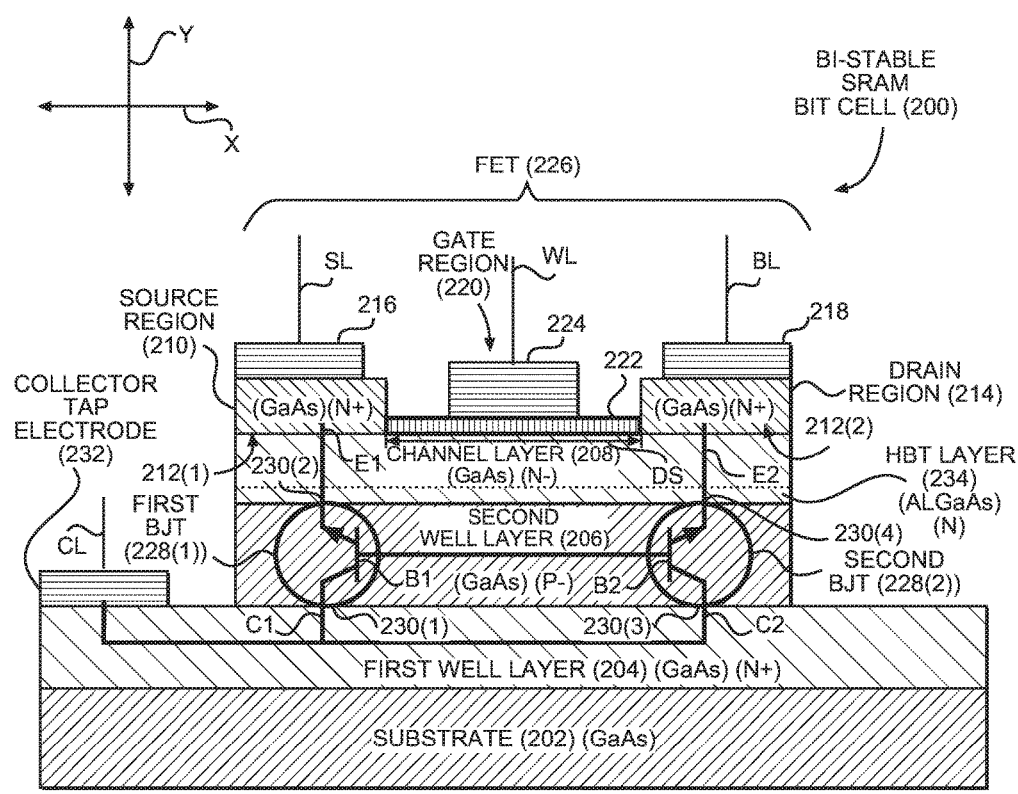
FIG. 2 is a cross-sectional diagram of an exemplary bi-stable SRAM bit cell formed from III-V compounds and configured to achieve higher operating speeds.

In this regard, FIG. 2 illustrates a cross-sectional view of an exemplary bi-stable SRAM bit cell 200 formed from III-V compounds and configured to achieve higher operating speeds. The bi-stable SRAM bit cell 200 includes a substrate 202 formed from a III-V compound. The bi-stable SRAM bit cell 200 also includes a first well layer 204 formed over the substrate 202 in a Y-axis direction (Y). The first well layer 204 is formed from a III-V compound doped with a first type material. The bi-stable SRAM bit cell 200 also includes a second well layer 206 formed over the first well layer 204 in the Y-axis direction (Y). The second well layer 206 is formed from a III-V compound doped with a second type material. Additionally, a channel layer 208 is formed over the second well layer 206 in the Y-axis direction (Y) from a III-V compound doped with the first type material. A source region 210 is formed over a first side 212(1) of the channel layer 208 in the Y-axis direction (Y). A drain region 214 is formed over a second side 212(2) of the channel layer 208 in the Y-axis direction (Y), wherein the drain region 214 is formed a distance DS in an X-axis direction (X) from the source region 210. The source and drain regions 210, 214 are each formed from a III-V compound doped with the first type material. In this aspect, a source electrode 216 is disposed on the source region 210 to access the source region 210, and a drain electrode 218 is disposed on the drain region 214 to access the drain region 214. In this aspect, the source and drain electrodes 216, 218 are each employed as a metal electrode. Further, a gate region 220 is formed over the channel layer 208 in the Y-axis direction (Y). In this aspect, the gate region 220 includes a gate oxide layer 222 disposed over the channel layer 208, and a metal gate 224 disposed over the gate oxide layer 222. In this manner, the bi-stable SRAM bit cell is formed using one (1) FET 226 corresponding to the channel layer 208, the source region 210, the drain region 214, and the gate region 220.

With continuing reference to FIG. 2, as a non-limiting example, the III-V compound of the substrate 202, the first well layer 204, the second well layer 206, the channel layer 208, the source region 210, and the drain region 214 is Gallium-Arsenide (GaAs). However, other aspects may employ alternative III-V compounds. For example, another aspect can include the III-V compound of Indium-Phosphide (InP) for the substrate 202, the first well layer 204, and the second well layer 206. In such an aspect, the channel layer 208, the source region 210, and the drain region 214 can include Indium-Gallium-Arsenide (InGaAs). Further, in aspects described herein, the first type material is an N-type material, while the second type material is a P-type material. In particular, an N+ type material indicates a material with a relatively high dopant level of N-type dopant, while an N− type material indicates a material with a relatively low dopant level of N-type dopant. Further, a P+ type material indicates a material with a relatively high dopant level of P-type dopant, while a P− type material indicates a material with a relatively lower dopant level of P-type dopant. Other aspects may employ the first type material as a P-type material, while the second type material may be an N-type material.

With continuing reference to FIG. 2, employing the elements described above also results in a first BJT 228(1) and a second BJT 228(2) being formed within the bi-stable SRAM bit cell 200. Because the first type material is an N-type material and the second type material is a P-type material in this aspect, the first and second BJTs 228(1), 228(2) are referred to as NPN BJTs 228(1), 228(2). In particular, the first BJT 228(1) is formed from junctions 230(1), 230(2) between the first well layer 204 (e.g., GaAs, N+) and the second well layer 206 (e.g., GaAs, P−), and between the second well layer 206 (e.g., GaAs, P−) and the channel layer 208 (e.g., GaAs, N−), respectively. The first BJT 228(1) includes a base B1 corresponding to the second well layer 206 (e.g., GaAs, P−), a collector C1 corresponding to the first well layer 204 (e.g., GaAs, N+), and an emitter E1 corresponding to the source region 210 (e.g., GaAs, N+). The second BJT 228(2) is formed from junctions 230(3), 230(4) between the first well layer 204 (e.g., GaAs, N+) and the second well layer 206 (e.g., GaAs, P−), and between the second well layer 206 (e.g., GaAs, P−) and the channel layer 208 (e.g., GaAs, N−), respectively. The second BJT 228(2) includes a base B2 corresponding to the second well layer 206 (e.g., GaAs, P−), a collector C2 corresponding to the first well layer 204 (e.g., GaAs, N+), and an emitter E2 corresponding to the drain region 214 (e.g., GaAs, N+). Based on the formation of the first and second BJTs 228(1), 228(2), a charge can be stored in the second well layer 206, wherein the charge corresponds to a data value of the bi-stable SRAM bit cell 200. A collector tap electrode 232 is disposed on the first well layer 204 and configured to provide access to the collectors C1, C2 of the first and second BJTs 228(1), 228(2) for read and write operations. Importantly, the III-V compounds used in the bi-stable SRAM bit cell 200 have a higher electron mobility than materials employed in conventional CMOS technology. Thus, forming the bi-stable SRAM bit cell 200 using the III-V compounds allows the bi-stable SRAM bit cell 200 to achieve higher operating speeds than conventional bi-stable SRAM bit cells formed from materials with a lower electron mobility.

With continuing reference to FIG. 2, the first and second BJTs 228(1), 228(2) described above are referred to as homojunction BJTs, because the same materials are used for base-emitter junctions (i.e., the junctions 230(2), 230(4)) and collector-emitter junctions (i.e., the junctions 230(1), 230(3)). However, other aspects may employ the first and second BJTs 228(1), 228(2) as heterojunction bipolar transistors (HBTs). As used herein, an HBT is a BJT that employs different semiconductor materials for the base-emitter junctions (i.e., junctions 230(2), 230(4)) and the collector-emitter junctions (i.e., junctions 230(1), 230(3)), wherein HBTs are capable of operating at higher frequencies than homojunction BJTs. As a non-limiting example, employing an HBT layer 234 formed over the second well layer 206 and below the channel layer 208 in the Y-axis direction (Y) from a III-V compound doped with the first type material (e.g., N) and having a higher band gap value than a band gap value of the second well layer 206 results in the first and second BJTs 228(1), 228(2) being HBTs. For example, the HBT layer 234 may be formed from Aluminum-Gallium-Arsenide (AlGaAs) or Gallium-Indium-Phosphide (GaInP).

With continuing reference to FIG. 2, details of performing read and write operations on the bi-stable SRAM bit cell 200 are now discussed. In this regard, the source region 210 is electrically coupled to a source line SL, the drain region 214 is electrically coupled to a bit line BL, the gate region 220 is electrically coupled to a word line WL, and the collector tap electrode 232 is electrically coupled to a collector tap line CT. To write a data value "0," a supply voltage (e.g., Vdd) is applied to the word line WL and the collector tap line CT, and a negative voltage is applied to the source line SL. Applying the supply voltage (Vdd) to the word line WL activates the FET 226 such that current can flow in the channel layer 208. Additionally, applying the supply voltage (Vdd) to each collector C1, C2 via the collector tap line CT while a negative voltage is applied to the emitter E2 via the source line SL causes positive carriers (i.e., holes) that are stored in the second well layer 206 to flow from the second well layer 206 to the source line SL. Thus, the combination of voltages described above moves (i.e., drains) positive carriers from the second well layer 206 such that the data value "0" is written to the bi-stable SRAM bit cell 200. Further, to write a data value "1," the supply voltage (e.g., Vdd) is applied to the collector tap line CT and the word line WL, and a voltage less than the supply voltage (e.g., Vdd-0.7V) is applied to the bit line BL. Applying the supply voltage (Vdd) to the word line WL activates the FET 226 such that current can flow in the channel layer 208. Additionally, applying the supply voltage (Vdd) to the collectors C1, C2 results in positive carriers (i.e., holes) flowing into the second well layer 206. Thus, the combination of voltages described above "puts" positive carriers into the second well layer 206 such that the data value "1" is written to the bi-stable SRAM bit cell 200.

With continuing reference to FIG. 2, to read the value stored in the bi-stable SRAM bit cell 200, the supply voltage (e.g., Vdd) is applied to the source line SL, the bit line BL, and the collector tap line CT, and a divided source voltage (e.g., Vdd/2) is applied to the word line WL. In this manner, the FET 226 is partially activated such that reduced current flows across the channel layer 208. Additionally, both BJTs 228(1), 228(2) are in a cut-off and floating state. The charge stored in the second well layer 206 is read out onto the bit line BL, which can be sensed to determine the read data value. Additionally, the bi-stable SRAM bit cell 200 can be set to a stand-by state when no write or read operation is in progress. To operate in the stand-by state, 0V are applied to the word line WL, and the supply voltage (e.g., Vdd) is applied to the source line SL, the bit line BL, and the collector tap line CT. In this manner, the FET 226 is not activated such that no current flows across the channel layer 208. Additionally, both BJTs 228(1), 228(2) are in a cut-off and floating state. Thus, the charge stored in the second well layer 206 remains unchanged such that the data value of "0" or "1" is maintained.

Figure 3:
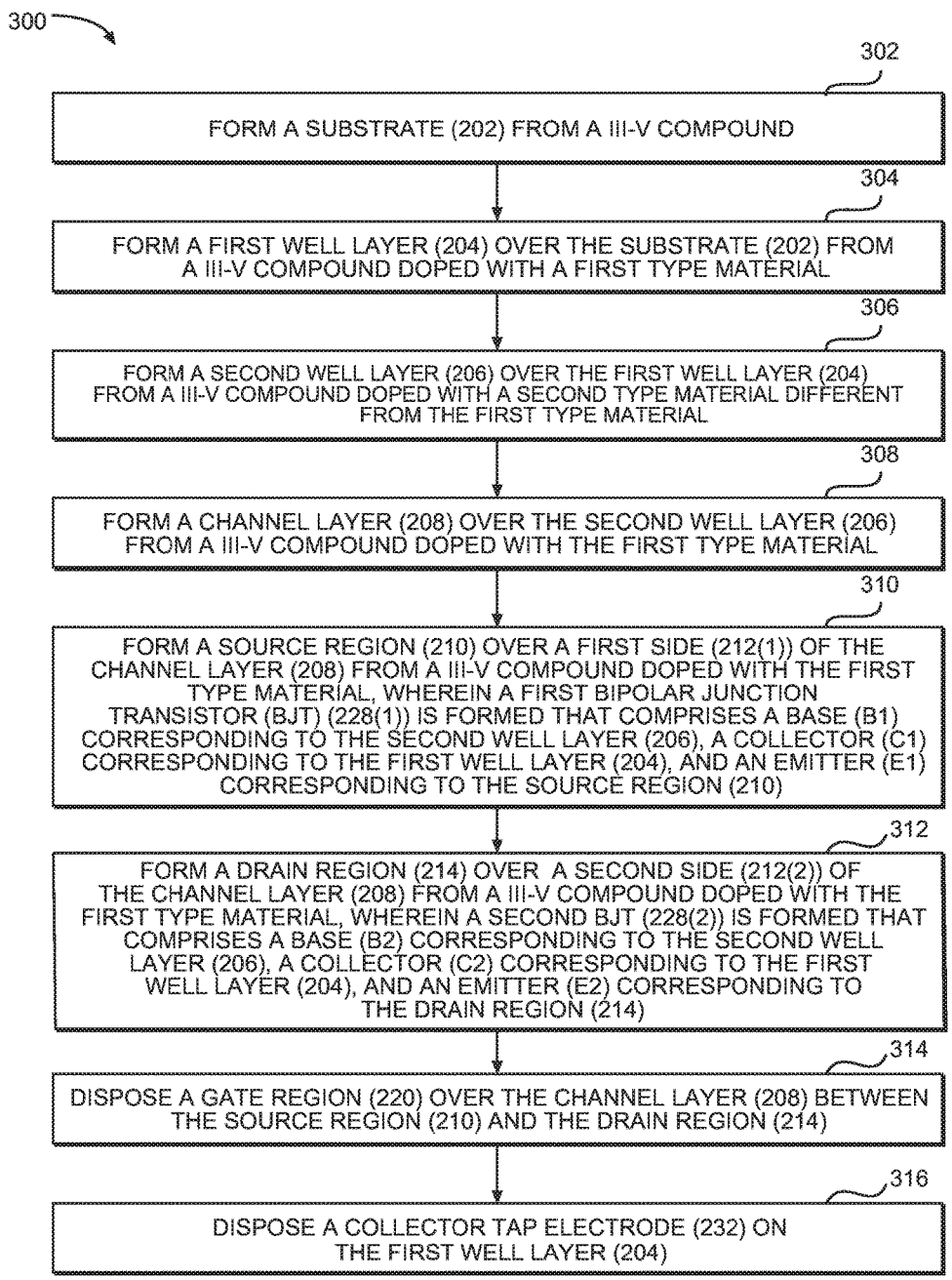
FIG. 3 provides a flowchart illustrating an exemplary process for fabricating the bi-stable SRAM bit cell of FIG. 2 formed from III-V compounds and configured to achieve higher operating speeds.

FIG. 3 illustrates an exemplary fabrication process 300 for the bi-stable SRAM bit cell 200 of FIG. 2 formed from III-V compounds and configured to achieve higher operating speeds. FIGS. 4A-4E provide cross-sectional diagrams of the bi-stable SRAM bit cell 200 of FIG. 2 illustrating respective stages 400(1)-400(5) of the fabrication process 300 in FIG. 3. The cross-sectional diagrams illustrating the bi-stable SRAM bit cell 200 in FIGS. 4A-4E will be discussed in conjunction with the discussion of the exemplary steps in the fabrication process 300 in FIG. 3.

Figure 4A:
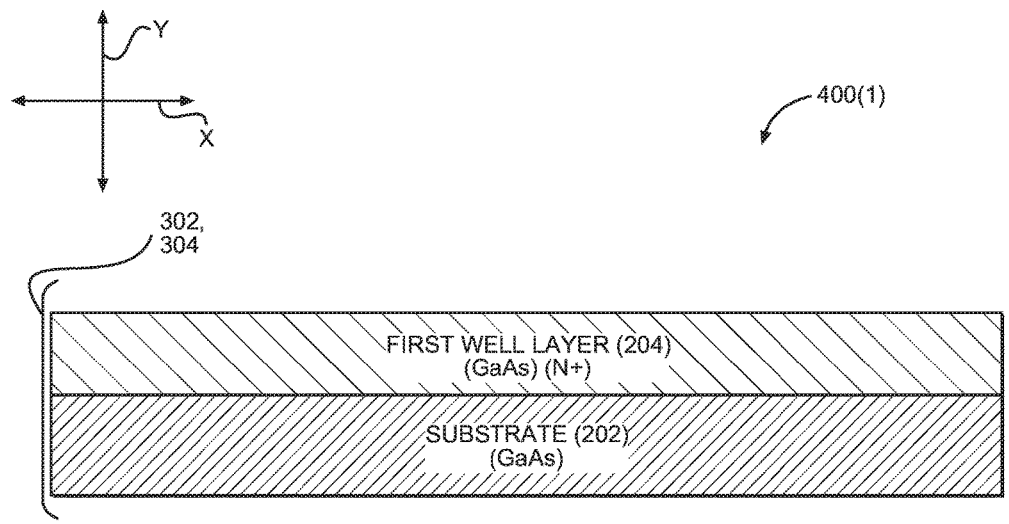
FIGS. 4A-4E are cross-sectional diagrams of the bi-stable SRAM bit cell of FIG. 2 at each stage of the process of fabrication in FIG. 3.
Figure 4B:
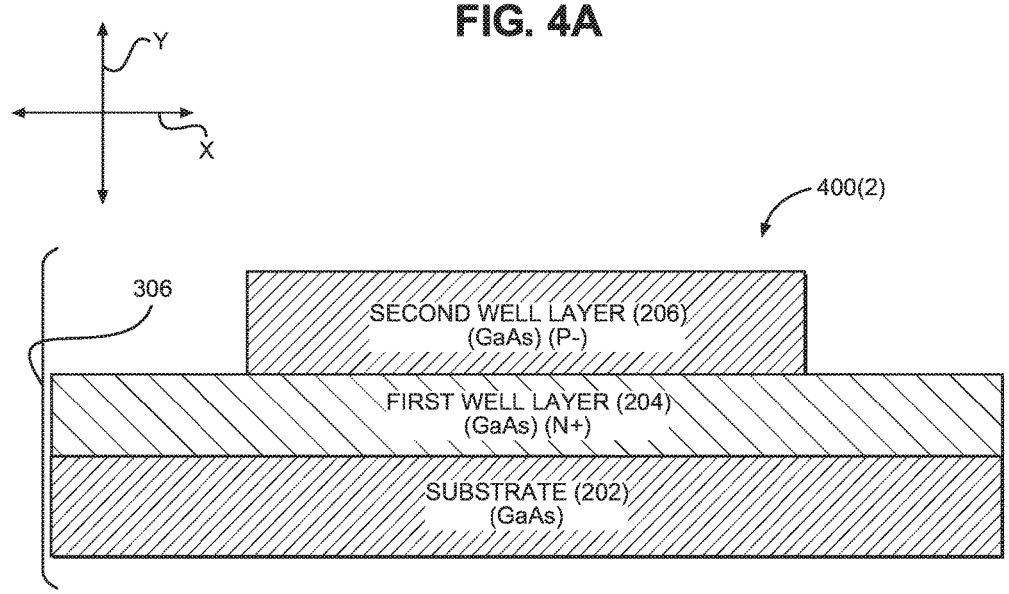
Figure 4C:
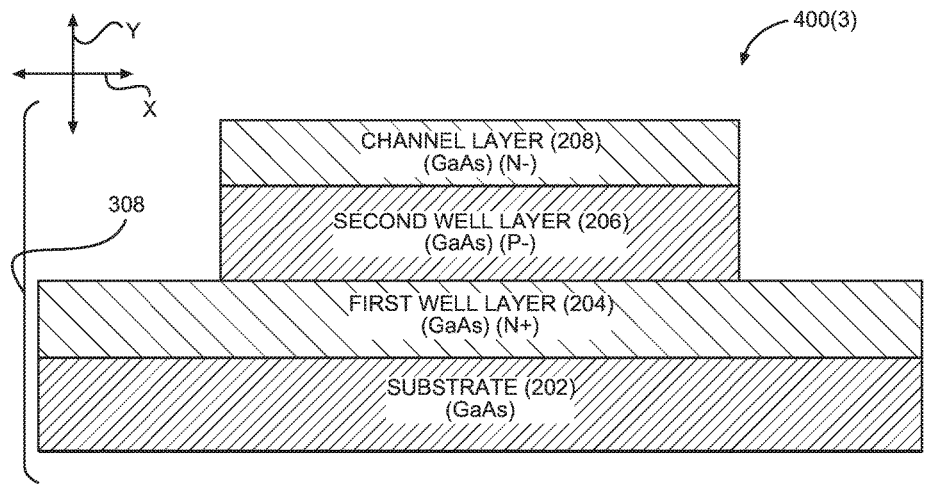
Figure 4D:
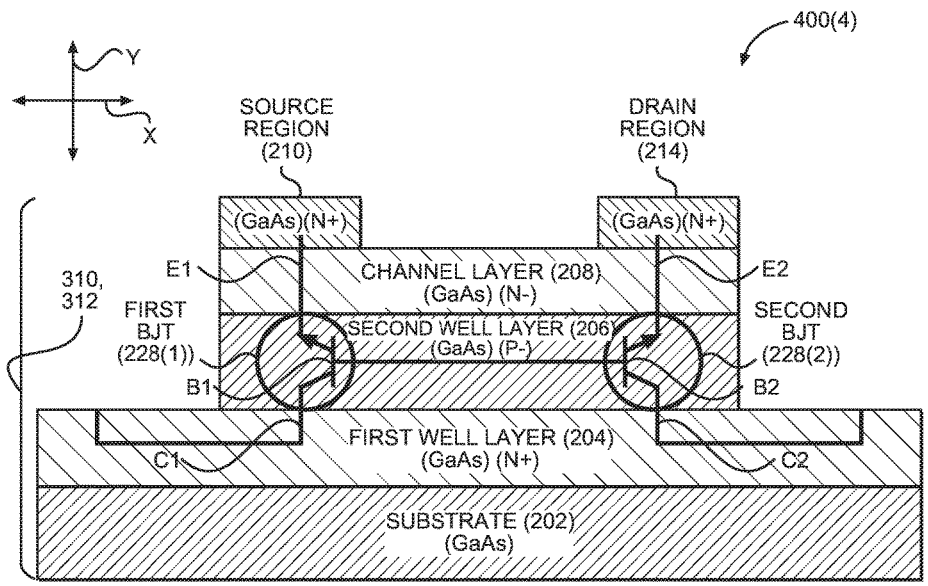
Figure 4E:
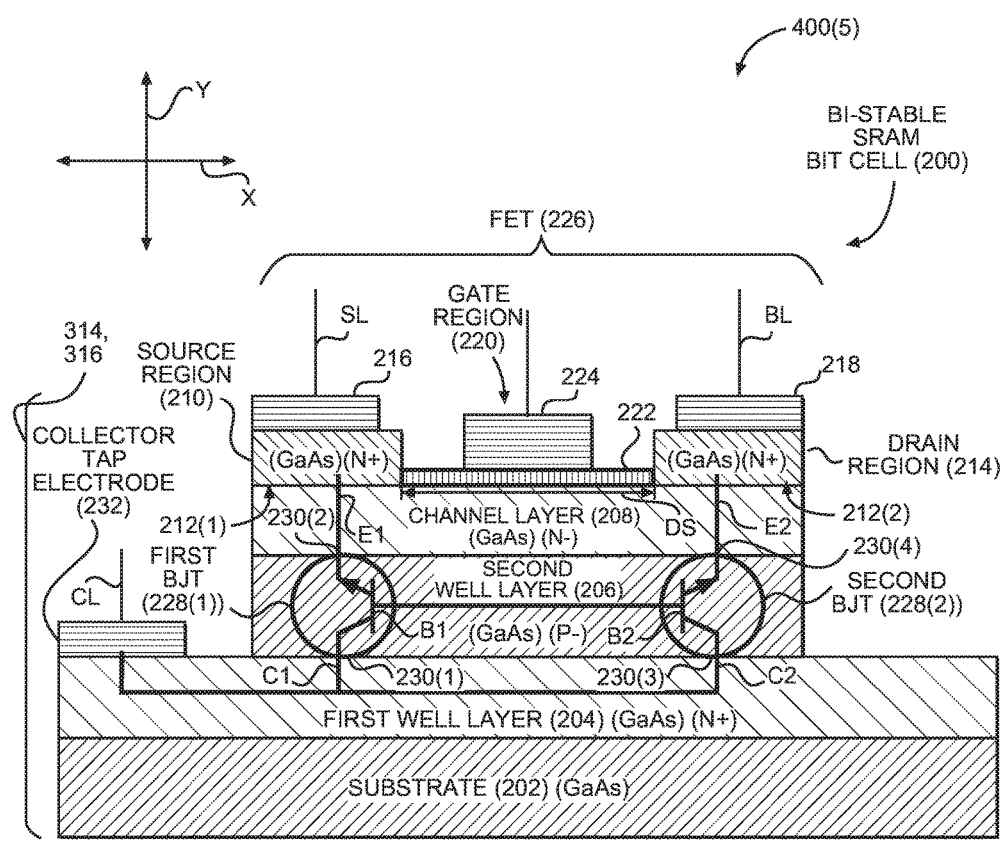

In this regard, the fabrication process 300 in FIG. 3 includes forming the substrate 202 from the III-V compound (e.g., GaAs) (block 302, stage 400(1) of FIG. 4A). The fabrication process 300 also includes forming the first well layer 204 over the substrate 202 from a III-V compound doped with the first type material (e.g., GaAs, N+) (block 304, stage 400(1) of FIG. 4A). Additionally, the fabrication process 300 includes forming the second well layer 206 over the first well layer 204 from a III-V compound doped with the second type material different from the first type material (e.g., GaAs, P-) (block 306, stage 400(2) of FIG. 4B). The fabrication process 300 also includes forming the channel layer 208 over the second well layer 206 from a III-V compound doped with the first type material (e.g., GaAs, N-) (block 308, stage 400(3) of FIG. 4C). Further, the fabrication process 300 includes forming the source region 210 over the first side 212(1) of the channel layer 208 from a III-V compound doped with the first type material (e.g., GaAs, N+) (block 310, stage 400(4) of FIG. 4D). As described above, forming the elements in this manner results in the first BJT 228(1) being formed that includes the base B1 corresponding to the second well layer 206, the collector C1 corresponding to the first well layer 204, and the emitter E1 corresponding to the source region 210. The fabrication process 300 also includes forming the drain region 214 over the second side 212(2) of the channel layer 208 from the III-V compound doped with the first type material (e.g., GaAs, N+) (block 312, stage 400(4) of FIG. 4D). As described above, forming the elements in this manner results in the second BJT 228(2) being formed that includes the base B2 corresponding to the second well layer 206, the collector C2 corresponding to the first well layer 204, and the emitter E2 corresponding to the drain region 214. The fabrication process 300 also includes disposing the gate region 220 over the channel layer 208 between the source region 210 and the drain region 214 (block 314, stage 400(5) of FIG. 4E). Further, the fabrication process 300 includes disposing the collector tap electrode 232 on the first well layer 204 (block 316, stage 400(5) of FIG. 4E). As a non-limiting example, forming the first well layer 204, the second well layer 206, the channel layer 208, and the source and drain regions 210, 214 can include growing each respective element using an epitaxial process compatible with the one or more III-V compounds employed (e.g., GaAs, AlGaAs, InP, etc.). In other words, the elements formed from III-V compounds in this aspect are epitaxially grown rather than fabricated using diffusion and etching processes employed for conventional CMOS technology.

Figure 5:
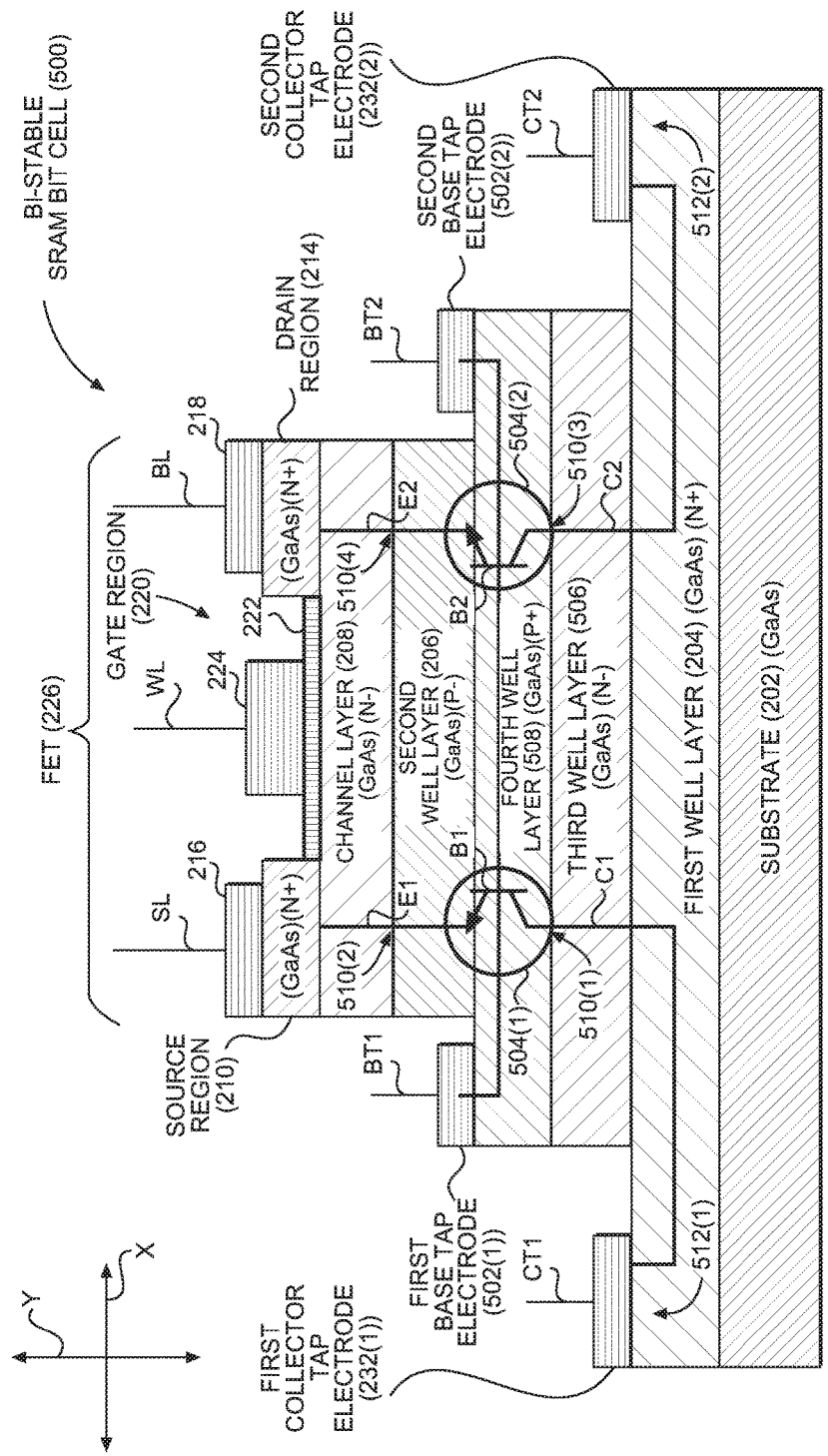
FIG. 5 is a cross-sectional diagram of an exemplary bi-stable SRAM bit cell formed from III-V compounds employing base tap electrodes that provide additional control for read and write operations.

In addition to the elements described in the bi-stable SRAM bit cell 200 in FIG. 2, other aspects may include additional elements that provide enhanced control and/or performance In this regard, FIG. 5 illustrates an exemplary bi-stable SRAM bit cell 500 formed from III-V compounds employing first and second base tap electrodes 502(1), 502(2) that provide additional control for read and write operations. In particular, the first and second base tap electrodes 502(1), 502(2) are electrically coupled to respective base tap lines BT1, BT2. In this manner, a voltage may be applied to each base tap line BT1, BT2 for greater control over a state of first and second BJTs 504(1), 504(2), which allows for greater control over read and write operations. The bi-stable SRAM bit cell 500 includes common elements with the bi-stable SRAM bit cell 200 of FIG. 2, which are referred to with common element numbers in FIG. 2 and FIG. 5, and thus will not be re-described herein.

With continuing reference to FIG. 5, the bi-stable SRAM bit cell 500 includes the substrate 202, the first well layer 204, the second well layer 206, and the channel layer 208. The bi-stable SRAM bit cell 500 also includes the source region 210, the drain region 214, and the gate region 220. To employ the first and second base tap electrodes 502(1), 502(2), the bi-stable SRAM bit cell 500 also includes a third well layer 506 and a fourth well layer 508. In particular, the third well layer 506 is formed over the first well layer 204 and below the second well layer 206 in a Y-axis direction (Y) from a III-V compound and doped with the first type material. For example, the third well layer 506 can be formed from the III-V compound Gallium-Arsenide (GaAs) doped with an N- type material, or from Indium-Phosphide (InP) doped with an N- type material. Additionally, the fourth well layer 508 is formed over the third well layer 506 and below the second well layer 206 in the Y-axis direction (Y) from a III-V compound and doped with the second type material. For example, the fourth well layer 508 can be formed from the III-V compound Gallium-Arsenide (GaAs) doped with a P+ type material, or from Indium-Phosphide (InP) doped with a P+ type material.

With continuing reference to FIG. 5, employing the elements described above also results in the first BJT 504(1) and the second BJT 504(2) being formed within the bi-stable SRAM bit cell 500. In particular, the first BJT 504(1) is formed from junctions 510(1), 510(2) between the third well layer 506 and the fourth well layer 508, and between the fourth well layer 508 and the channel layer 208, respectively. In this manner, the first BJT 504(1) includes a base B1 corresponding to the fourth well layer 508, a collector C1 corresponding to the first well layer 204, and an emitter E1 corresponding to the source region 210. The second BJT 504(2) is formed from junctions 510(3), 510(4) between the third well layer 506 and the fourth well layer 508, and between the fourth well layer 508 and the channel layer 208, respectively. In this manner, the second BJT 504(2) includes a base B2 corresponding to the fourth well layer 508, a collector C2 corresponding to the first well layer 204, and an emitter E2 corresponding to the drain region 214.

With continuing reference to FIG. 5, the bi-stable SRAM bit cell 500 also includes the first and second base tap electrodes 502(1), 502(2) disposed on the fourth well layer 508. To provide greater control over read and write operations of the bi-stable SRAM bit cell 500, voltages can be applied to the base tap lines BT1, BT2 to control the voltage of the bases B1, B2 of the first and second BJTs 504(1), 504(2), respectively. For example, a supply voltage (e.g., Vdd) can be applied to the base tap lines BT1, BT2 to assist with write operations, while a high impedance Z can be applied to the base tap lines BT1, BT2 to assist with read operations. While the bi-stable SRAM bit cell 500 includes the first and second base tap electrodes 502(1), 502(2), other aspects may include a single base tap electrode 502. Further, while the bi-stable SRAM bit cell 200 in FIG. 2 includes the collector tap electrode 232 to apply a voltage to the collectors C1, C2, the bi-stable SRAM bit cell 500 includes first and second collector tap electrodes 232(1), 232(2) for additional control over read and write operations of the bi-stable SRAM bit cell 500. In particular, the first collector tap electrode 232(1) is disposed on a first side 512(1) of the first well layer 204 similar to the collector tap electrode 232 in FIG. 2. The second collector tap electrode 232(2) is disposed on a second side 512(2) of the first well layer 204. In this manner, the first collector tap electrode 232(1) corresponds to the collector C1 of the first BJT 504(1), and the second collector tap electrode 232(2) corresponds to the collector C2 of the second BJT 504(2). The first and second collector tap electrodes 232(1), 232(2) are electrically coupled to collector tap lines CT1, CT2, respectively, such that voltages can be applied to the collector tap lines CT1, CT2 to control the state of the collectors C1, C2 of the first and second BJTs 504(1), 504(2), respectively.

Figure 6:
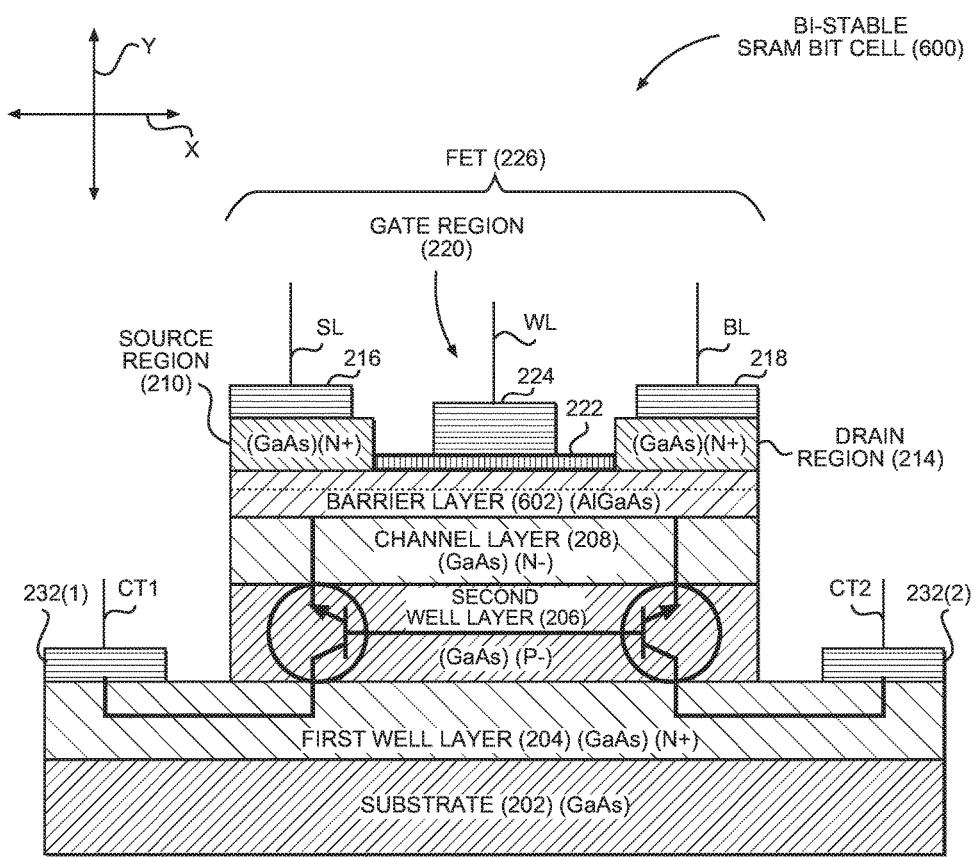
FIG. 6 is a cross-sectional diagram of an exemplary bi-stable SRAM bit cell formed from III-V compounds employing a barrier layer that increases electron mobility in a channel layer to increase the operating speed of the bi-stable SRAM bit cell.

FIG. 6 illustrates an exemplary bi-stable SRAM bit cell 600 formed from III-V compounds employing a barrier layer 602 that increases electron mobility in the channel layer 208 to increase the operating speed of the bi-stable SRAM bit cell 600. The bi-stable SRAM bit cell 600 includes common elements with the bi-stable SRAM bit cells 200, 500 of FIGS. 2 and 5, respectively, which are referred to with common element numbers in FIGS. 2, 5, and 6, and thus will not be re-described herein.

With continuing reference to FIG. 6, the bi-stable SRAM bit cell 600 includes the substrate 202, the first well layer 204, the second well layer 206, and the channel layer 208. However, the bi-stable SRAM bit cell 600 also includes the barrier layer 602 formed over the channel layer 208 and below the source region 210, the drain region 214, and the gate region 220 in a Y-axis direction (Y). The barrier layer 602 is formed from a III-V compound, and has a higher band gap value compared to a band gap value of the channel layer 208. As a non-limiting example, if the substrate 202, the first well layer 204, the second well layer 206, and the channel layer 208 are formed from Gallium-Arsenide (GaAs) having a band gap value of 1.42 electron Volts (eV) at 300 Kelvin (K), then the barrier layer 602 may be formed from Aluminum-Gallium-Arsenide (AlGaAs) having a band gap value of 1.75 eV at 300 K. Alternatively, if the substrate 202, the first well layer 204, and the second well layer 206 are formed from Indium-Phosphide (InP), and the channel layer 208, the source region 210, and the drain region 214 are formed from Indium-Gallium-Arsenide (InGaAs) having a band gap value of 0.75 eV at 300 K, then the barrier layer 602 may be formed from Indium-Aluminum-Arsenide (InAlAs) having a band gap value of 1.5 eV at 300 K. Forming the barrier layer 602 with a higher band gap value relative to the channel layer 208 results in electrons formed in the barrier layer 602 dropping into the channel layer 208 so that the barrier layer 602 is depleted. The electrons that drop into the channel layer 208 are highly concentrated in the lower band gap material, which causes the channel layer 208 to have a higher electron mobility. Increasing the electron mobility of the channel layer 208 causes the bi-stable SRAM bit cell 600 to operate at higher speeds, and thus with higher performance, compared to the aspects in FIGS. 2 and 5.

Figure 7:
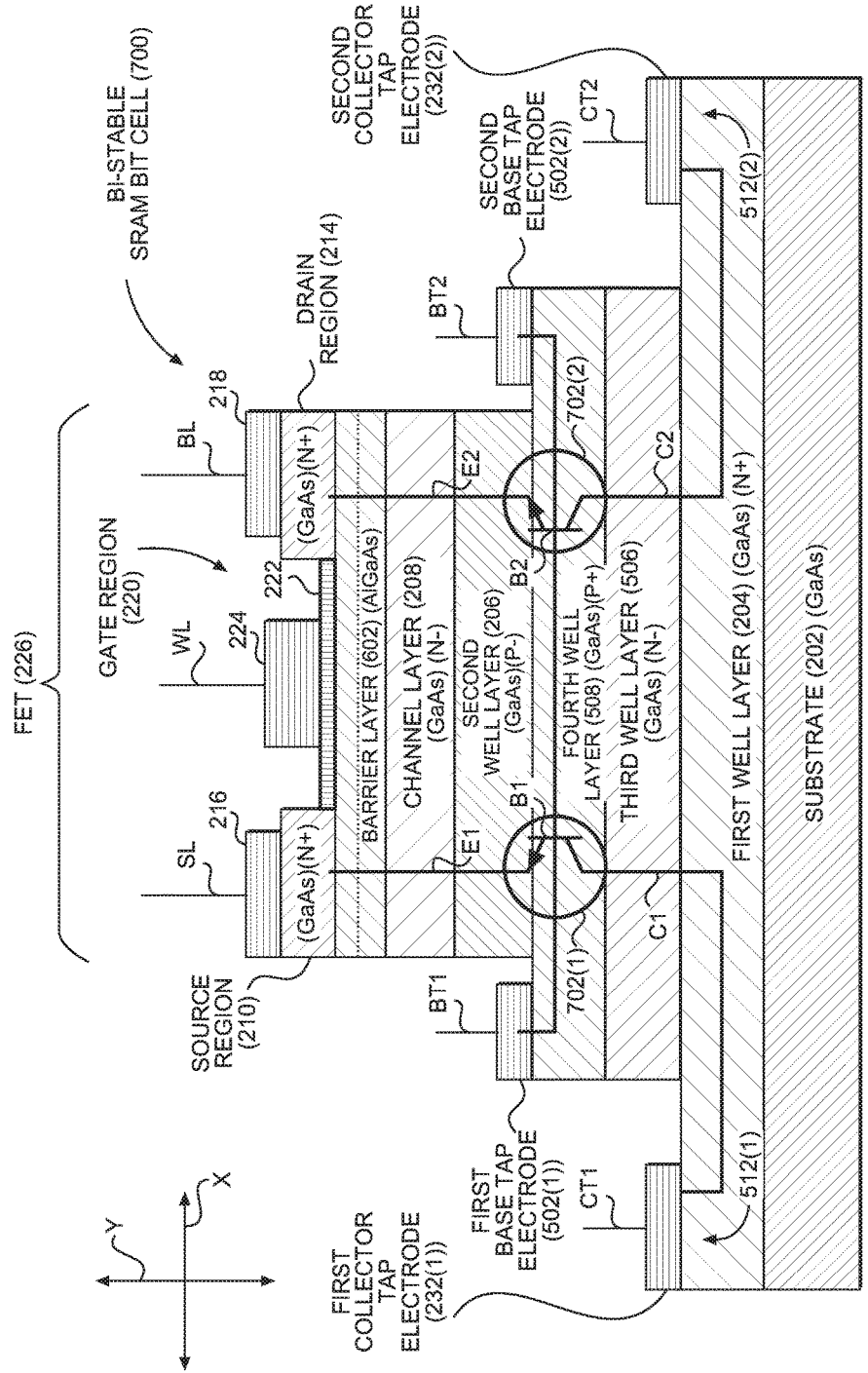
FIG. 7 is a cross-sectional diagram of an exemplary bi-stable SRAM bit cell formed from III-V compounds employing the base tap electrodes of FIG. 5 and the barrier layer of FIG. 6.

FIG. 7 illustrates an exemplary bi-stable SRAM bit cell 700 formed from III-V compounds employing the first and second base tap electrodes 502(1), 502(2) of FIG. 5 and the barrier layer 602 of FIG. 6. The bi-stable SRAM bit cell 700 includes common elements with the bi-stable SRAM bit cells 200, 500, and 600 of FIGS. 2, 5, and 6, respectively, which are referred to with common element numbers in FIGS. 2, 5, 6, and 7, and thus will not be re-described herein. By including both the first and second base tap electrodes 502(1), 502(2) of FIG. 5, the bi-stable SRAM bit cell 700 provides greater control over first and second BJTs 702(1), 702(2) during read and write operations as discussed with relation to FIG. 5. Additionally, by employing the barrier layer 602 of FIG. 6, the bi-stable SRAM bit cell 700 achieves higher operating speeds, as discussed with relation to FIG. 6.

Figure 8:
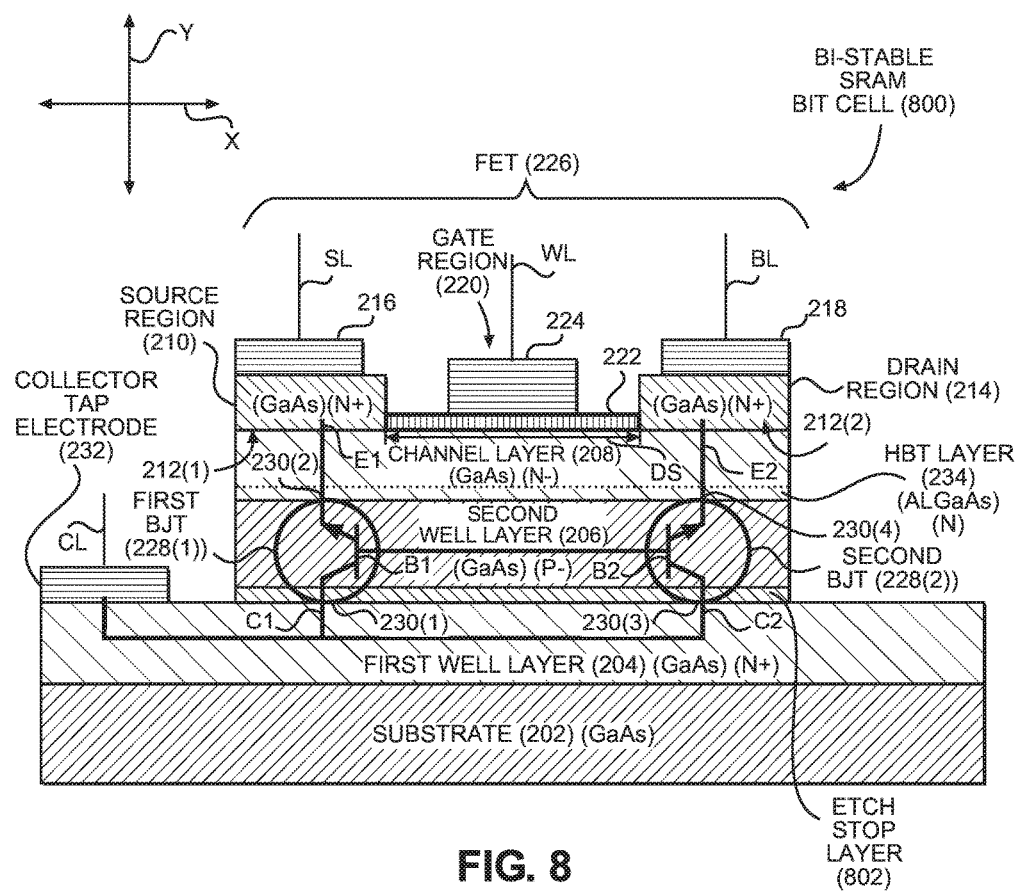
FIG. 8 is a cross-sectional diagram of an exemplary bi-stable SRAM bit cell employing an etch stop layer that improves the accuracy with which a first well layer is fabricated.

FIG. 8 illustrates an exemplary bi-stable SRAM bit cell 800 employing an etch stop layer 802 between the first well layer 204 and the second well layer 206 that improves the accuracy with which the first well layer 204 is fabricated. The bi-stable SRAM bit cell 800 includes common elements with the bi-stable SRAM bit cell 200 of FIG. 2, which are referred to with common element numbers in FIGS. 2 and 8, and thus will not be re-described herein. The etch stop layer 802 is formed from a III-V compound that has a higher etch selectivity than the III-V compound used to form the first well layer 204. For example, the etch stop layer 802 can be formed from Aluminum-Gallium-Arsenide (AlGaAs) or Gallium-Indium-Phosphide (GaInP) if the first well layer 204 is formed from Gallium-Arsenide (GaAs) or Indium-Phosphide (InP), respectively. In this manner, the III-V compound of the etch stop layer 802 protects the first well layer 204 from the etching process by reducing or preventing excessive etching of the first well layer 204. Thus, including the etch stop layer 802 between the first well layer 204 and the second well layer 206 allows the first well layer 204 to be fabricated with more precision in terms of thickness and shape.

Figure 9:
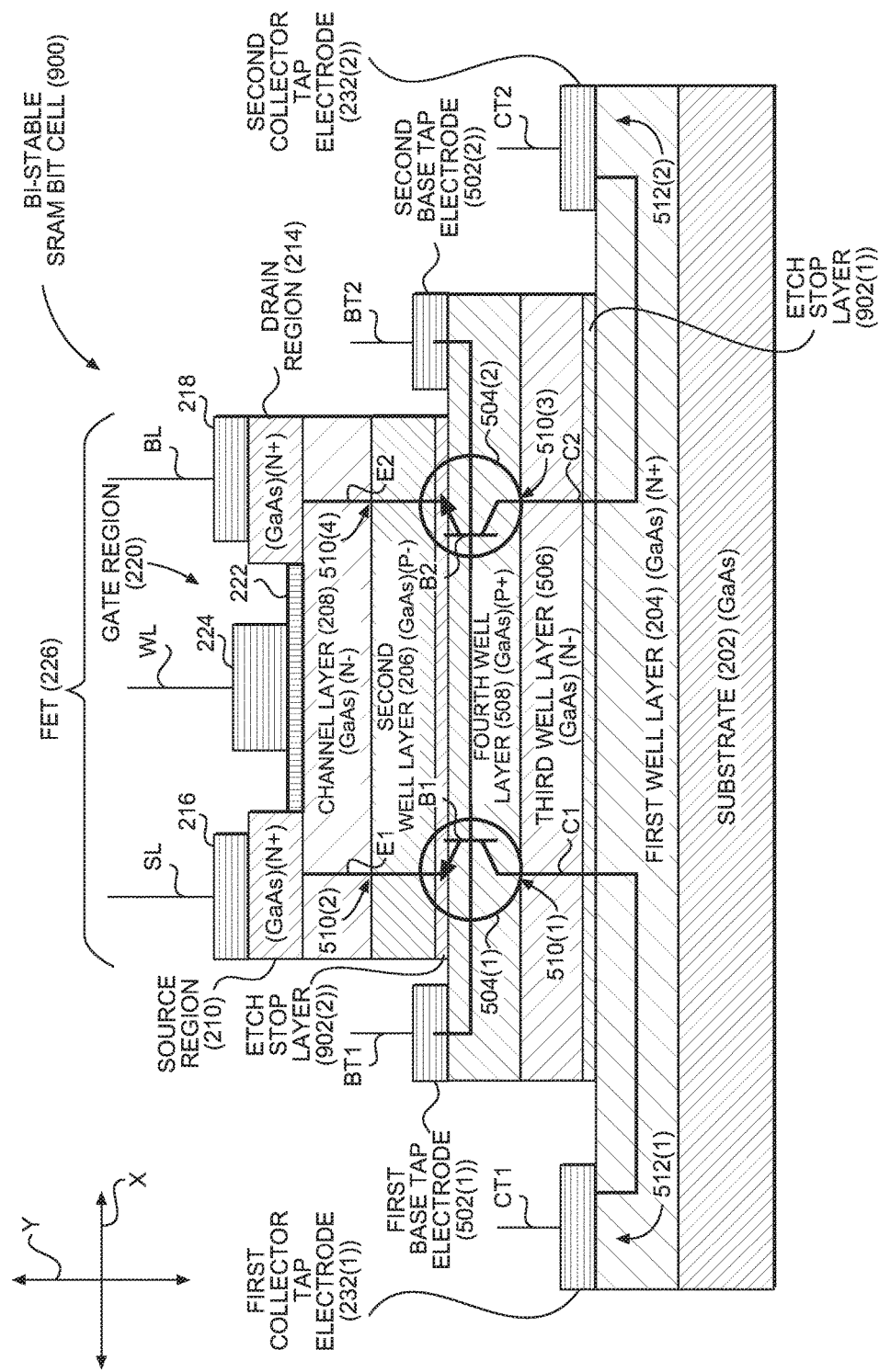
FIG. 9 is a cross-sectional diagram of an exemplary bi-stable SRAM bit cell employing multiple etch stop layers that improves the accuracy with which a first well layer and a second well layer are fabricated.

FIG. 9 illustrates an exemplary bi-stable SRAM bit cell 900 employing multiple etch stop layers 902(1), 902(2) that improves the accuracy with which the first well layer 204 and the fourth well layer 508 are fabricated. The bi-stable SRAM bit cell 900 includes common elements with the bi-stable SRAM bit cell 500 of FIG. 5, which are referred to with common element numbers in FIGS. 5 and 9, and thus will not be re-described herein. The etch stop layer 902(1) is formed between the first well layer 204 and the third well layer 506. The etch stop layer 902(2) is formed between the fourth well layer 508 and the second well layer 206. Further, the etch stop layers 902(1), 902(2) are formed from a III-V compound that has a higher etch selectivity than the III-V compound of the first and fourth well layers 204, 508, respectively. In this manner, the III-V compound of the etch stop layers 902(1), 902(2) protects the first and fourth well layers 204, 508, respectively, from the etching process by reducing or preventing excessive etching of the first and fourth well layers 204, 508. Thus, including the etch stop layers 902(1), 902(2) allows the first and fourth well layers 204, 508, respectively, to be fabricated with more precision in terms of thickness and shape.

Figure 10:
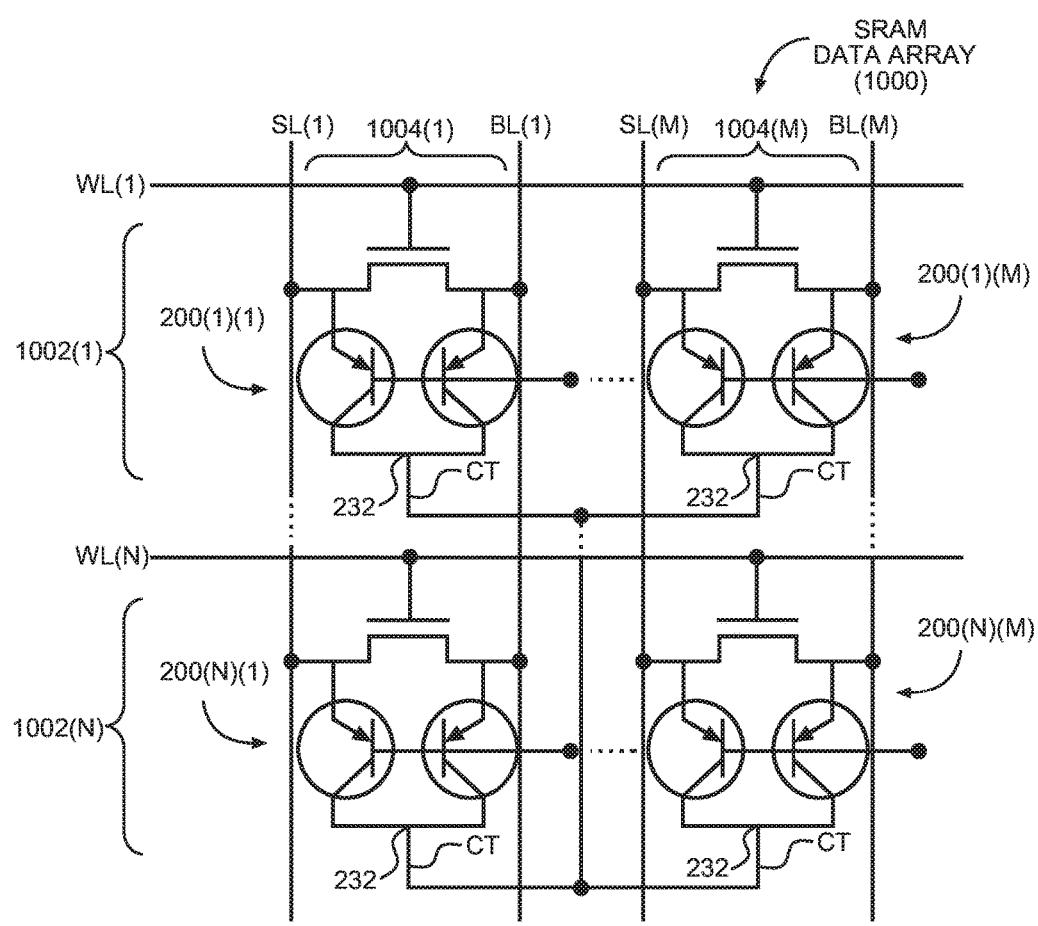
FIG. 10 is a circuit diagram of an exemplary SRAM data array employing the bi-stable SRAM bit cell of FIG. 2 formed from III-V compounds and configured to achieve higher operating speeds.

FIG. 10 illustrates an exemplary SRAM data array 1000 employing the bi-stable SRAM bit cell 200 of FIG. 2 formed from III-V compounds and configured to achieve higher operating speeds. The SRAM data array 1000 includes bi-stable SRAM bit cells 200(1)(1)-200(N)(M) organized into SRAM bit cell rows 1002(1)-1002(N) and SRAM bit cell columns 1004(1)-1004(M). In this manner, each bi-stable SRAM bit cell 200(1)(1)-200(N)(M) corresponds to a particular SRAM bit cell row 1002(1)-1002(N) and SRAM bit cell column 1004(1)-1004(M). Further, the SRAM data array 1000 employs a word line WL(1)-WL(N) electrically coupled to the gate region 220 of each bi-stable SRAM bit cell 200(1)(1)-200(N)(M) on each corresponding SRAM bit cell row 1002(1)-1002(N). In this manner, the word lines WL(1)-WL(N) can be used to access the selected bi-stable SRAM bit cells 200(1)(1)-200(N)(M) for read and write operations. The SRAM data array 1000 also employs source lines SL(1)-SL(M) electrically coupled to the source region 210 of each corresponding bi-stable SRAM bit cell 200(1)(1)-200(N)(M), and bit lines BL(1)-BL(M) electrically coupled to the drain region 214 of each corresponding bi-stable SRAM bit cell 200(1)(1)-200(N)(M). In this manner, the source lines SL(1)-SL(M) and bit lines BL(1)-BL (M) are used to drive voltages to the bi-stable SRAM bit cells 200(1)(1)-200(N)(M) of each corresponding SRAM bit cell column 1004(1)-1004(M). Each collector tap electrode 232 is configured to receive a voltage applied to a corresponding collector tap line CT. Although the SRAM data array 1000 is described as employing the bi-stable SRAM bit cell 200 of FIG. 2, other aspects may employ the bi-stable SRAM bit cell 500 of FIG. 5, the bi-stable SRAM bit cell 600 of FIG. 6, or the bi-stable SRAM bit cell 700 of FIG. 7.

The elements described herein are sometimes referred to as means for performing particular functions. In this regard, the substrate 202 is sometimes referred to herein as "a means for providing a substrate formed from a III-V compound." The first well layer 204 is sometimes referred to herein as "a means for providing a first well layer formed over the substrate from a III-V compound doped with a first type material." The second well layer 206 is sometimes referred to herein as "a means for providing a second well layer formed over the first well layer from a III-V compound doped with a second type material different from the first type material." The channel layer 208 is sometimes referred to herein as "a means for providing a channel layer formed over the second well layer from a III-V compound doped with the first type material." The source region 210 is sometimes referred to herein as "a means for providing a source region formed over a first side of the channel layer from a III-V compound doped with the first type material, wherein a first BJT is formed that comprises a base corresponding to the second well layer, a collector corresponding to the first well layer, and an emitter corresponding to the source region." The drain region 214 is sometimes referred to herein as "a means for providing a drain region formed over a second side of the channel layer from a III-V compound doped with the first type material, wherein a second BJT is formed that comprises a base corresponding to the second well layer, a collector corresponding to the first well layer, and an emitter corresponding to the drain region." The gate region 220 is sometimes referred to herein as "a means for providing a gate region disposed over the channel layer between the source region and the drain region." The collector tap electrode 232 is sometimes referred to herein as "a means for providing a collector tap electrode disposed on the first well layer." The third well layer 506 is sometimes referred to herein as "a means for providing a third well layer formed over the first well layer and below the second well layer from a III-V compound doped with the first type material." The fourth well layer 508 is sometimes referred to herein as "a means for providing a fourth well layer formed below the second well layer and over the third well layer from a III-V compound doped with the second type material." The first base tap electrode 502(1) is sometimes referred to herein as "a means for providing a base tap electrode disposed on the fourth well layer." The barrier layer 602 is sometimes referred to herein as "a means for providing a barrier layer formed over the channel layer and below the source region, the drain region, and the gate region from a III-V compound, wherein a band gap value of the barrier layer is higher than a band gap value of the channel layer."

The bi-stable SRAM bit cells formed from III-V compounds and configured to achieve higher operating speeds according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
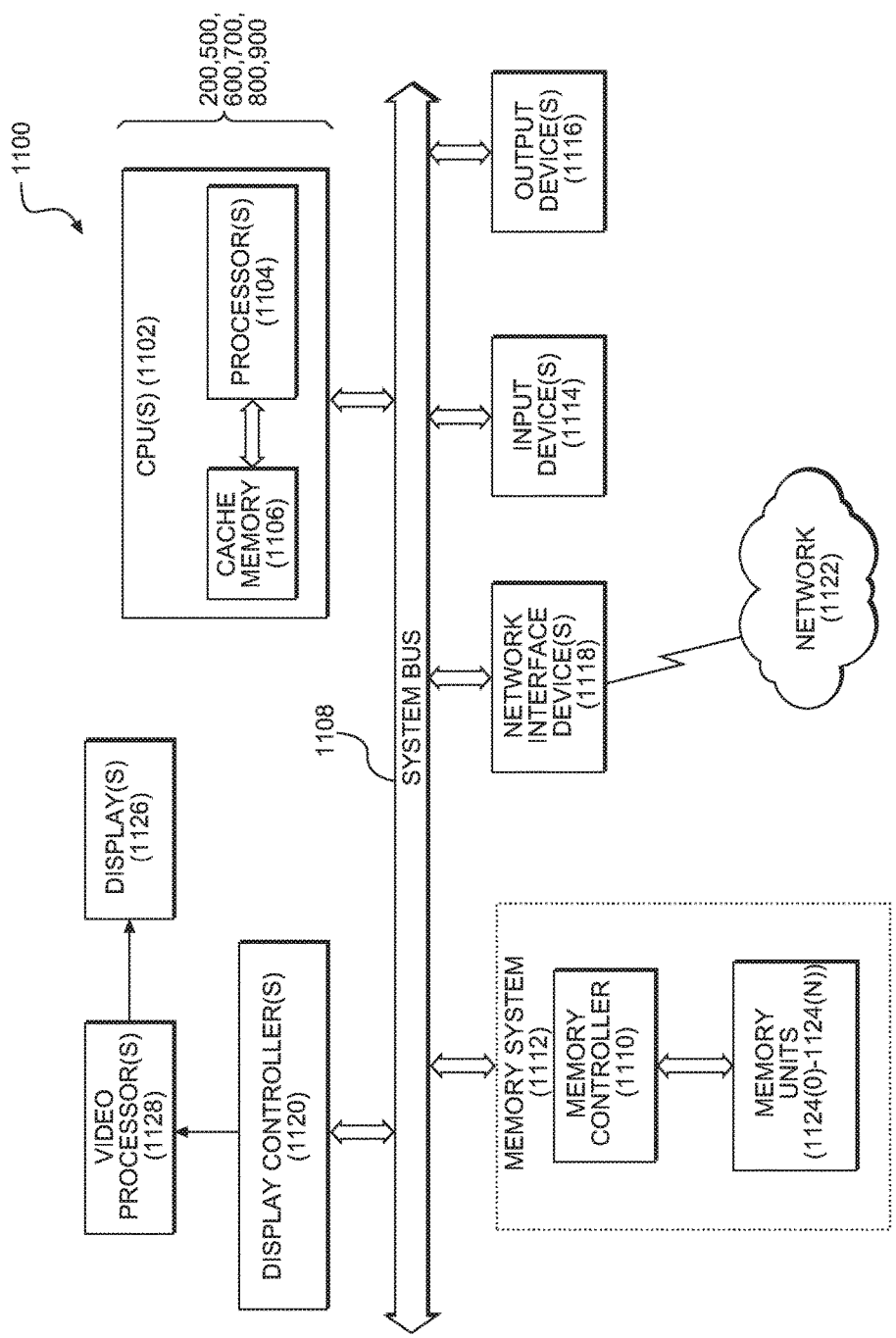
FIG. 11 is a block diagram of an exemplary processor-based system that can include elements employing the bi-stable SRAM bit cells of FIGS. 2 and 5-9.

In this regard, FIG. 11 illustrates an example of a processor-based system 1100 that can include elements employing the bi-stable SRAM bit cells 200, 500, 600, 700, 800, and 900 of FIGS. 2 and 5-9, respectively. In this example, the processor-based system 1100 includes one or more central processing units (CPUs) 1102, each including one or more processors 1104. The CPU(s) 1102 may have cache memory 1106 coupled to the processor(s) 1104 for rapid access to temporarily stored data. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 1108 constitutes a different fabric.

Other master and slave devices can be connected to the system bus 1108. As illustrated in FIG. 11, these devices can include a memory system 1112, one or more input devices 1114, one or more output devices 1116, one or more network interface devices 1118, and one or more display controllers 1120, as examples. The input device(s) 1114 can include any type of input device, including, but not limited to, input keys, switches, voice processors, etc. The output device(s) 1116 can include any type of output device, including, but not limited to, audio, video, other visual indicators, etc. The network interface device(s) 1118 can be any device configured to allow exchange of data to and from a network 1122. The network 1122 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1118 can be configured to support any type of communications protocol desired. The memory system 1112 can include one or more memory units 1124 (0)-1124(N).

The CPU(s) 1102 may also be configured to access the display controller(s) 1120 over the system bus 1108 to control information sent to one or more displays 1126. The display controller(s) 1120 sends information to the display (s) 1126 to be displayed via one or more video processors 1128, which process the information to be displayed into a format suitable for the display(s) 1126. The display(s) 1126 can include any type of display, including, but not limited to, a cathode ray tube (CRT), a liquid crystal display (LCD), a plasma display, a light emitting diode (LED) display, etc.

Figure 12:
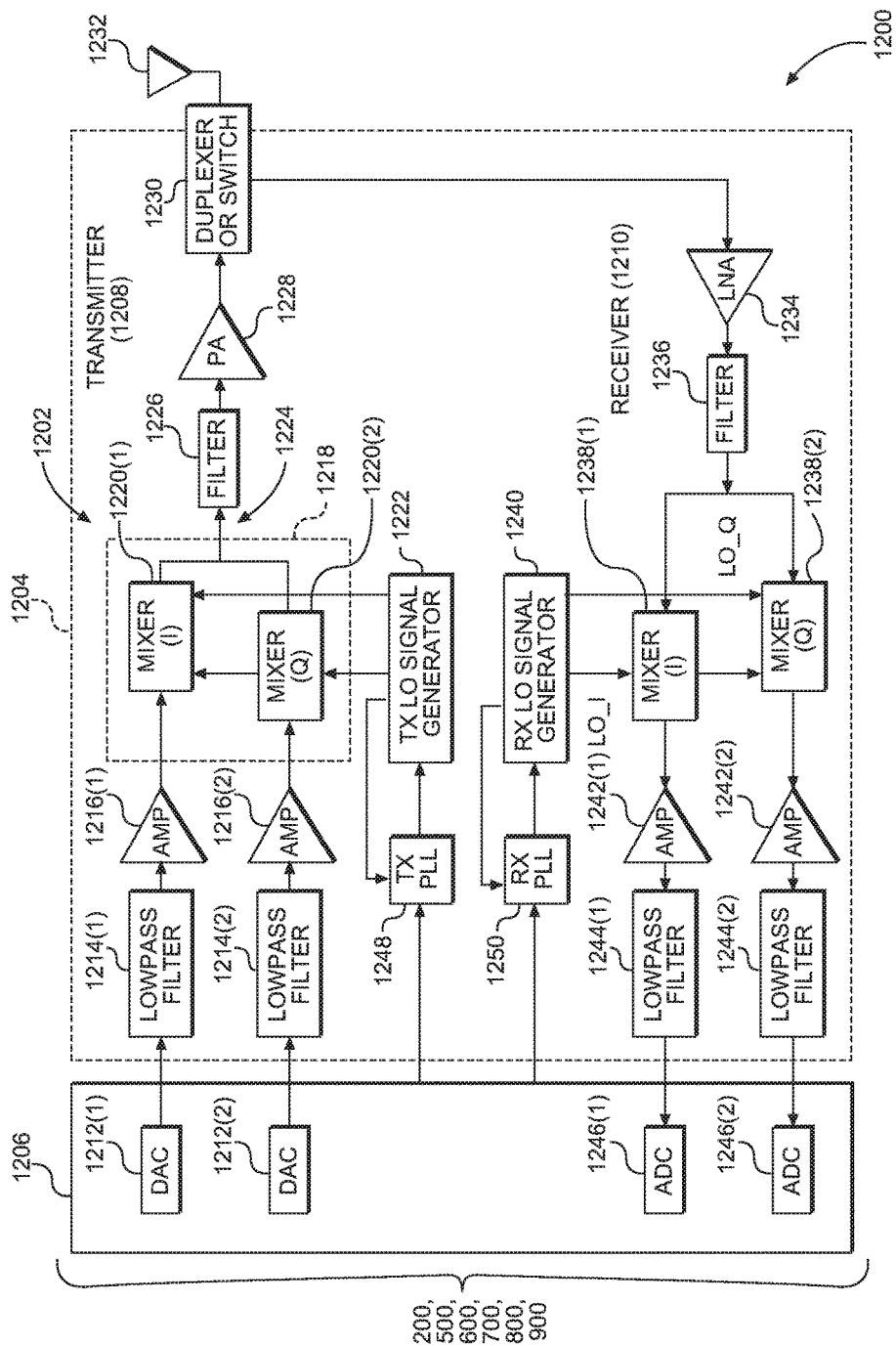
FIG. 12 is a block diagram of an exemplary wireless communications device that includes radio frequency (RF) components formed in an integrated circuit (IC), wherein the RF components can include elements employing the bi-stable SRAM bit cells of FIGS. 2 and 5-9.

FIG. 12 illustrates an exemplary wireless communications device 1200 that includes radio frequency (RF) components formed in an integrated circuit (IC) 1202, wherein the RF components can include elements employing the bi-stable SRAM bit cells 200, 500, 600, 700, 800, and 900 of FIGS. 2 and 5-9, respectively. In this regard, the wireless communications device 1200 may be provided in the IC 1202. The wireless communications device 1200 may include or be provided in any of the above referenced devices, as examples. As shown in FIG. 12, the wireless communications device 1200 includes a transceiver 1204 and a data processor 1206. The data processor 1206 may include a memory to store data and program codes. The transceiver 1204 includes a transmitter 1208 and a receiver 1210 that support bi-directional communication. In general, the wireless communications device 1200 may include any number of transmitters and/or receivers for any number of communication systems and frequency bands. All or a portion of the transceiver 1204 may be implemented on one or more analog ICs, RF ICs (RFICs), mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1210. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog-converters (DACs) 1212(1), 1212(2) for converting digital signals generated by the data processor 1206 into the I and Q analog output signals, e.g., I and Q output currents, for further processing.

Within the transmitter 1208, lowpass filters 1214(1), 1214(2) filter the I and Q analog output signals, respectively, to remove undesired signals caused by the prior digital-to-analog conversion. Amplifiers (AMP) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals through mixers 1220(1), 1220(2) from a TX LO signal generator 1222 to provide an upconverted signal 1224. A filter 1226 filters the upconverted signal 1224 to remove undesired signals caused by the frequency upconversion as well as noise in a receive frequency band. A power amplifier (PA) 1228 amplifies the upconverted signal 1224 from the filter 1226 to obtain the desired output power level and provides a transmit RF signal. The transmit RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Downconversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by amplifiers (AMP) 1242(1), 1242(2) and further filtered by lowpass filters 1244(1), 1244(2) to obtain I and Q analog input signals, which are provided to the data processor 1206. In this example, the data processor 1206 includes analog-to-digital-converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency upconversion, while the RX LO signal generator 1240 generates the I and Q RX LO signals used for frequency downconversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A bi-stable static random access memory (SRAM) bit cell, comprising:
    a substrate formed from a III-V compound;
    a first well layer formed over the substrate from a III-V compound doped with a first type material;
    a second well layer formed over the first well layer from a III-V compound doped with a second type material different from the first type material;
    a channel layer formed over the second well layer from a III-V compound doped with the first type material;
    a source region formed over a first side of the channel layer from a III-V compound doped with the first type material, wherein a first bipolar junction transistor (BJT) is formed that comprises a base corresponding to the second well layer, a collector corresponding to the first well layer, and an emitter corresponding to the source region;
    a drain region formed over a second side of the channel layer from a III-V compound doped with the first type material, wherein a second BJT is formed that comprises a base corresponding to the second well layer, a collector corresponding to the first well layer, and an emitter corresponding to the drain region;
    a gate region disposed over the channel layer between the source region and the drain region; and
    a collector tap electrode disposed on the first well layer.

2. The bi-stable SRAM bit cell of claim 1, further comprising a second collector tap electrode disposed on the first well layer, wherein:
    the collector tap electrode corresponds to the collector of the first BJT; and
    the second collector tap electrode corresponds to the collector of the second BJT.

3. The bi-stable SRAM bit cell of claim 1, further comprising:
    a source electrode disposed on the source region; and
    a drain electrode disposed on the drain region,
    wherein the gate region comprises:
        a gate oxide layer disposed over the channel layer; and
        a metal gate disposed over the gate oxide layer.

4. The bi-stable SRAM bit cell of claim 1, wherein:
    the source region is electrically coupled to a source line;
    the drain region is electrically coupled to a bit line;
    the gate region is electrically coupled to a word line; and
    the collector tap electrode is electrically coupled to a collector tap line.

5. The bi-stable SRAM bit cell of claim 1, wherein:
    the first type material is an N-type material; and
    the second type material is a P-type material,
    wherein:
        the first BJT is an NPN BJT; and
        the second BJT is an NPN BJT.

6. The bi-stable SRAM bit cell of claim 1, wherein:
    the III-V compound of the substrate is Gallium-Arsenide (GaAs);
    the III-V compound of the first well layer is Gallium-Arsenide (GaAs);
    the III-V compound of the second well layer is Gallium-Arsenide (GaAs);
    the III-V compound of the channel layer is Gallium-Arsenide (GaAs);
    the III-V compound of the source region is Gallium-Arsenide (GaAs); and
    the III-V compound of the drain region is Gallium-Arsenide (GaAs).

7. The bi-stable SRAM bit cell of claim 1, wherein:
    the III-V compound of the substrate is Indium-Phosphide (InP);
    the III-V compound of the first well layer is Indium-Phosphide (InP);
    the III-V compound of the second well layer is Indium-Phosphide (InP);
    the III-V compound of the channel layer is Indium-Gallium-Arsenide (InGaAs);
    the III-V compound of the source region is Indium-Gallium-Arsenide (InGaAs); and
    the III-V compound of the drain region is Indium-Gallium-Arsenide (InGaAs).

8. The bi-stable SRAM bit cell of claim 1, further comprising:
    a third well layer formed over the first well layer and below the second well layer from a III-V compound doped with the first type material;
    a fourth well layer formed over the third well layer and below the second well layer from a III-V compound doped with the second type material; and
    a base tap electrode disposed on the fourth well layer.

9. The bi-stable SRAM bit cell of claim 8, wherein:
    the source region is electrically coupled to a source line;
    the drain region is electrically coupled to a bit line;
    the gate region is electrically coupled to a word line;
    the collector tap electrode is electrically coupled to a collector tap line; and
    the base tap electrode is electrically coupled to a base tap line.

10. The bi-stable SRAM bit cell of claim 8, further comprising a second base tap electrode disposed on the fourth well layer, wherein:
the base tap electrode corresponds to the base of the first BJT; and
the second base tap electrode corresponds to the base of the second BJT.

11. The bi-stable SRAM bit cell of claim 1, further comprising a barrier layer formed over the channel layer and below the source region, the drain region, and the gate region from a III-V compound, wherein a band gap value of the barrier layer is higher than a band gap value of the channel layer.

12. The bi-stable SRAM bit cell of claim 11, further comprising:
a third well layer formed over the first well layer and below the second well layer from a III-V compound doped with the first type material;
a fourth well layer formed below the second well layer and over the third well layer from a III-V compound doped with the second type material; and
a base tap electrode disposed on the fourth well layer.

13. The bi-stable SRAM bit cell of claim 11, wherein:
the III-V compound of the substrate is Gallium-Arsenide (GaAs);
the III-V compound of the first well layer is Gallium-Arsenide (GaAs);
the III-V compound of the second well layer is Gallium-Arsenide (GaAs);
the III-V compound of the channel layer is Gallium-Arsenide (GaAs);
the III-V compound of the source region is Gallium-Arsenide (GaAs);
the III-V compound of the drain region is Gallium-Arsenide (GaAs); and
the III-V compound of the barrier layer is Aluminum-Gallium-Arsenide (AlGaAs).

14. The bi-stable SRAM bit cell of claim 11, wherein:
the III-V compound of the substrate is Indium-Phosphide (InP);
the III-V compound of the first well layer is Indium-Phosphide (InP);
the III-V compound of the second well layer is Indium-Phosphide (InP);
the III-V compound of the channel layer is Indium-Gallium-Arsenide (InGaAs);
the III-V compound of the source region is Indium-Gallium-Arsenide (InGaAs);
the III-V compound of the drain region is Indium-Gallium-Arsenide (InGaAs); and
the III-V compound of the barrier layer is Indium-Aluminum-Arsenide (InAlAs).

15. The bi-stable SRAM bit cell of claim 1, further comprising a heterojunction bipolar transistor (HBT) layer formed over the second well layer and below the channel layer from a III-V compound doped with the first type material and having a higher band gap value than a band gap value of the second well layer, wherein the HBT layer results in the first BJT and the second BJT functioning as HBTs.

16. The bi-stable SRAM bit cell of claim 15, wherein the III-V compound of the HBT layer is a material selected from the group consisting of: Aluminum-Gallium-Arsenide (AlGaAs) and Gallium-Indium-Phosphide (GaInP).

17. The bi-stable SRAM bit cell of claim 1 integrated into an integrated circuit (IC).

18. The bi-stable SRAM bit cell of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A method of manufacturing a bi-stable static random access memory (SRAM) bit cell, comprising:
forming a substrate from a III-V compound;
forming a first well layer over the substrate from a III-V compound doped with a first type material;
forming a second well layer over the first well layer from a III-V compound doped with a second type material different from the first type material;
forming a channel layer over the second well layer from a III-V compound doped with the first type material;
forming a source region over a first side of the channel layer from a III-V compound doped with the first type material, wherein a first bipolar junction transistor (BJT) is formed that comprises a base corresponding to the second well layer, a collector corresponding to the first well layer, and an emitter corresponding to the source region;
forming a drain region over a second side of the channel layer from a III-V compound doped with the first type material, wherein a second BJT is formed that comprises a base corresponding to the second well layer, a collector corresponding to the first well layer, and an emitter corresponding to the drain region;
disposing a gate region over the channel layer between the source region and the drain region; and
disposing a collector tap electrode on the first well layer.

20. The method of claim 19, wherein:
forming the substrate comprises growing the substrate with an epitaxial process;
forming the first well layer comprises growing the first well layer with an epitaxial process;
forming the second well layer comprises growing the second well layer with an epitaxial process;
forming the channel layer comprises growing the channel layer with an epitaxial process;
forming the source region comprises growing the source region with an epitaxial process; and
forming the drain region comprises growing the drain region with an epitaxial process.

21. The method of claim 19, further comprising:
forming a third well layer over the first well layer and below the second well layer from a III-V compound doped with the first type material;
forming a fourth well layer below the second well layer and over the third well layer from a III-V compound doped with the second type material; and
disposing a base tap electrode on the fourth well layer.

22. The method of claim 19, further comprising forming a barrier layer over the channel layer and below the source region, the drain region, and the gate region from a III-V compound, wherein a band gap value of the barrier layer is higher than a band gap value of the channel layer.

23. A static random access memory (SRAM) data array, comprising a plurality of bi-stable SRAM bit cells organized into a plurality of SRAM bit cell rows and a plurality of SRAM bit cell columns, wherein each bi-stable SRAM bit cell of the plurality of bi-stable SRAM bit cells corresponds to an SRAM bit cell row and an SRAM bit cell column, and comprises:
- a substrate formed from a III-V compound;
- a first well layer formed over the substrate from a III-V compound doped with a first type material;
- a second well layer formed over the first well layer from a III-V compound doped with a second type material different from the first type material;
- a channel layer formed over the second well layer from a III-V compound doped with the first type material;
- a source region formed over a first side of the channel layer from a III-V compound doped with the first type material, wherein a first bipolar junction transistor (BJT) is formed that comprises a base corresponding to the second well layer, a collector corresponding to the first well layer, and an emitter corresponding to the source region;
- a drain region formed over a second side of the channel layer from a III-V compound doped with the first type material, wherein a second BJT is formed that comprises a base corresponding to the second well layer, a collector corresponding to the first well layer, and an emitter corresponding to the drain region;
- a gate region disposed over the channel layer between the source region and the drain region; and
- a collector tap electrode disposed on the first well layer.

24. The SRAM data array of claim 23, wherein each bi-stable SRAM bit cell of the plurality of bi-stable SRAM bit cells further comprises:
- a source electrode disposed on the source region; and
- a drain electrode disposed on the drain region,
- wherein the gate region comprises:
  - a gate oxide layer disposed over the channel layer; and
  - a metal gate disposed over the gate oxide layer.

25. The SRAM data array of claim 23, wherein:
the source region of each bi-stable SRAM bit cell of the plurality of bi-stable SRAM bit cells is electrically coupled to a corresponding source line;
the drain region of each bi-stable SRAM bit cell of the plurality of bi-stable SRAM bit cells is electrically coupled to a corresponding bit line;
the gate region of each bi-stable SRAM bit cell of the plurality of bi-stable SRAM bit cells is electrically coupled to a corresponding word line; and
the collector tap electrode of each bi-stable SRAM bit cell of the plurality of bi-stable SRAM bit cells is electrically coupled to a corresponding collector tap line.

26. The SRAM data array of claim 23, wherein:
the first type material is an N-type material; and
the second type material is a P-type material,
wherein:
the first BJT is an NPN BJT; and
the second BJT is an NPN BJT.

27. The SRAM data array of claim 23, wherein each bi-stable SRAM bit cell of the plurality of bi-stable SRAM bit cells further comprises:
- a third well layer formed over the first well layer and below the second well layer from a III-V compound doped with the first type material;
- a fourth well layer formed below the second well layer and over the third well layer from a III-V compound doped with the second type material; and
- a base tap electrode formed on the fourth well layer.

28. The SRAM data array of claim 27, wherein:
the source region of each bi-stable SRAM bit cell of the plurality of bi-stable SRAM bit cells is electrically coupled to a source line;
the drain region of each bi-stable SRAM bit cell of the plurality of bi-stable SRAM bit cells is electrically coupled to a bit line;
the gate region of each bi-stable SRAM bit cell of the plurality of bi-stable SRAM bit cells is electrically coupled to a word line;
the collector tap electrode of each bi-stable SRAM bit cell of the plurality of bi-stable SRAM bit cells is electrically coupled to a collector tap line; and
the base tap electrode of each bi-stable SRAM bit cell of the plurality of bi-stable SRAM bit cells is electrically coupled to a base tap line.

29. The SRAM data array of claim 23, wherein each bi-stable SRAM bit cell of the plurality of bi-stable SRAM bit cells further comprises a barrier layer formed over the channel layer and below the source region, the drain region, and the gate region from a III-V compound, wherein a band gap value of the barrier layer is higher than a band gap value of the channel layer.

* * * * *